US009876039B2

(12) United States Patent
Hirano et al.

(10) Patent No.: US 9,876,039 B2
(45) Date of Patent: Jan. 23, 2018

(54) THIN-FILM TRANSISTOR SUBSTRATE, THIN-FILM TRANSISTOR SUBSTRATE MANUFACTURING METHOD, AND LIQUID CRYSTAL DISPLAY

(71) Applicant: Mitsubishi Electric Corporation, Chiyoda-ku (JP)

(72) Inventors: Rii Hirano, Tokyo (JP); Naoki Nakagawa, Tokyo (JP); Takaaki Murakami, Tokyo (JP); Kazunori Inoue, Kumamoto (JP); Koji Oda, Kumamoto (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/538,107

(22) PCT Filed: Jan. 5, 2016

(86) PCT No.: PCT/JP2016/050057
§ 371 (c)(1),
(2) Date: Jun. 20, 2017

(87) PCT Pub. No.: WO2016/111267
PCT Pub. Date: Jul. 14, 2016

(65) Prior Publication Data
US 2017/0373098 A1 Dec. 28, 2017

(30) Foreign Application Priority Data
Jan. 8, 2015 (JP) ................. 2015-002049

(51) Int. Cl.
*H01L 29/78* (2006.01)
*H01L 27/12* (2006.01)
(Continued)

(52) U.S. Cl.
CPC ........ *H01L 27/1259* (2013.01); *H01L 27/124* (2013.01); *H01L 27/1248* (2013.01);
(Continued)

(58) Field of Classification Search
CPC ... H01L 29/42; H01L 29/423; H01L 29/4238; H01L 29/42384; H01L 29/78;
(Continued)

(56) References Cited

U.S. PATENT DOCUMENTS 8,193,045 B2    6/2012  Omura et al.
8,278,657 B2   10/2012  Sakata et al.
(Continued)

FOREIGN PATENT DOCUMENTS

JP    2008-10440 A    1/2008
JP    2009-10362 A    1/2009
(Continued)

OTHER PUBLICATIONS

International Search Report dated Apr. 12, 2016, in PCT/JP2016/050057 filed Jan. 5, 2016.

*Primary Examiner* — Monica D Harrison
(74) *Attorney, Agent, or Firm* — Oblon, McClelland, Maier & Neustadt, L.L.P.

(57) ABSTRACT

A thin-film transistor substrate constituting a liquid crystal display includes: a thin-film transistor including, a gate electrode, a gate insulating film covering the gate electrode, a semiconductor layer opposing the gate electrode via the gate insulating film, a channel protective film covering the semiconductor layer, a protective film covering over the channel protective film, source and drain electrodes in contact with the semiconductor layer through first contact holes penetrating through the protective film and the channel protective film; a first electrode electrically connected to the drain electrode; a gate wiring extending from the gate
(Continued)

electrode; and a source wiring electrically connected to the source electrode. The source wiring and first electrode are respectively electrically connected to the source electrode and drain electrode through respective second contact holes penetrating through the protective film. The first electrode and source wiring have a first transparent conductive film formed on the first insulation film.

13 Claims, 19 Drawing Sheets

(51) Int. Cl.
  *H01L 29/423*   (2006.01)
  *H01L 29/786*   (2006.01)

(52) U.S. Cl.
  CPC .... *H01L 27/1255* (2013.01); *H01L 29/42384* (2013.01); *H01L 29/786* (2013.01)

(58) Field of Classification Search
  CPC ..... H01L 29/786; H01L 27/12; H01L 27/124; H01L 27/125; H01L 27/1248; H01L 27/1255; H01L 27/1259
  USPC .......................................................... 257/72
  See application file for complete search history.

(56) References Cited

U.S. PATENT DOCUMENTS

| | | | |
|---|---|---|---|
| 8,643,009 B2 | 2/2014 | Sakata et al. | |
| 8,697,488 B2 * | 4/2014 | Sasaki | H01L 27/1225 257/E21.411 |
| 9,190,420 B2 | 11/2015 | Nagayama et al. | |
| 9,343,487 B2 | 5/2016 | Nagayama et al. | |
| 2007/0295967 A1 | 12/2007 | Harada et al. | |

FOREIGN PATENT DOCUMENTS

| | | |
|---|---|---|
| JP | 2010-212672 A | 9/2010 |
| JP | 2014-215485 A | 11/2014 |

* cited by examiner

F I G. 9
F I G. 10
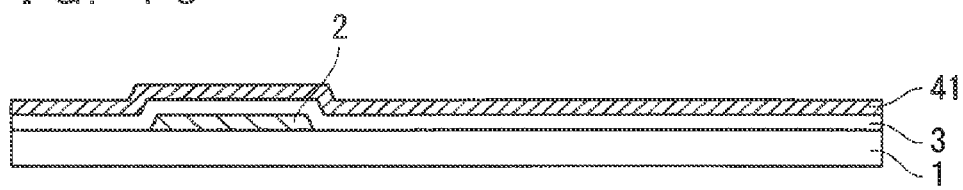
F I G. 11
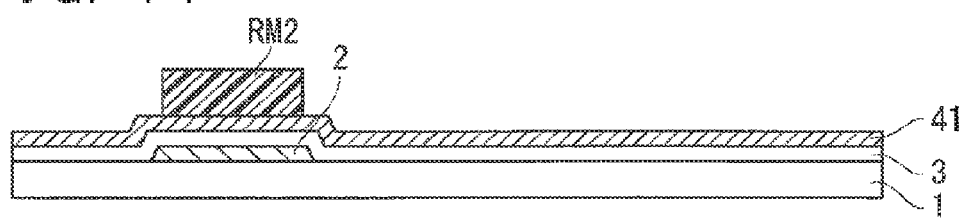
F I G. 12
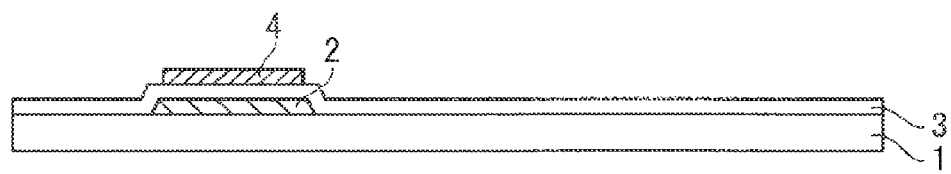
F I G. 13
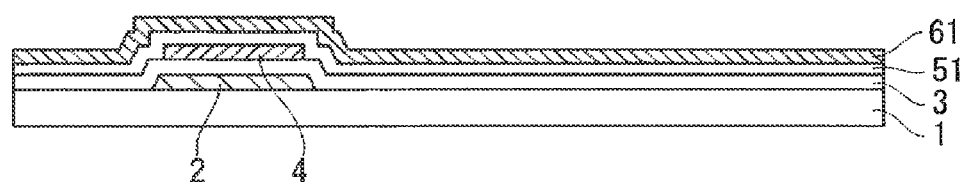
F I G. 14
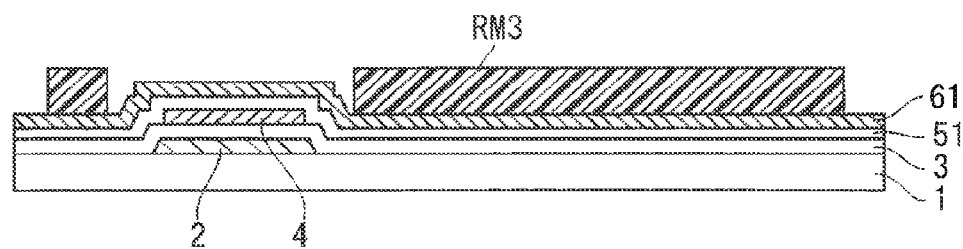

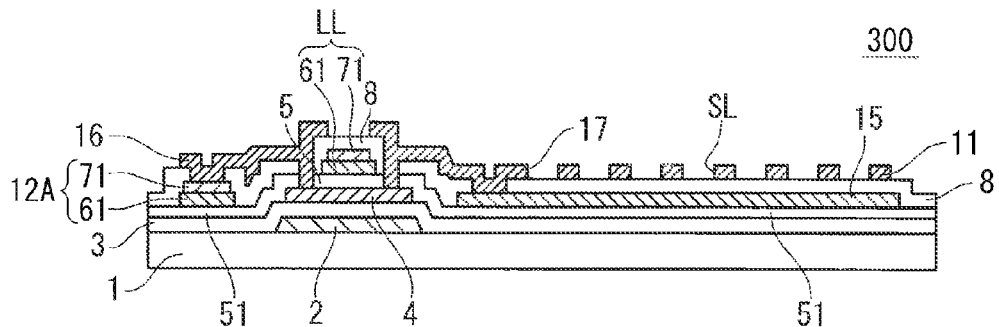
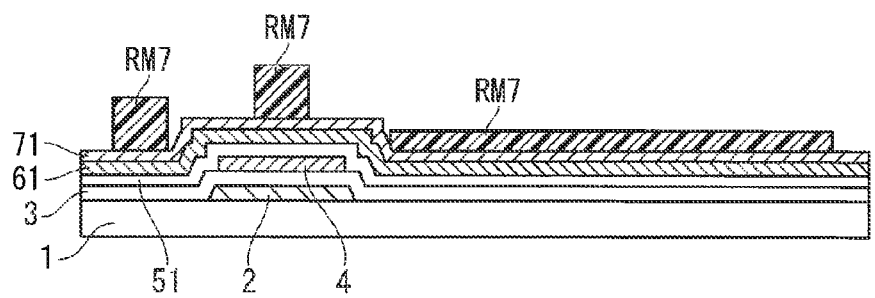
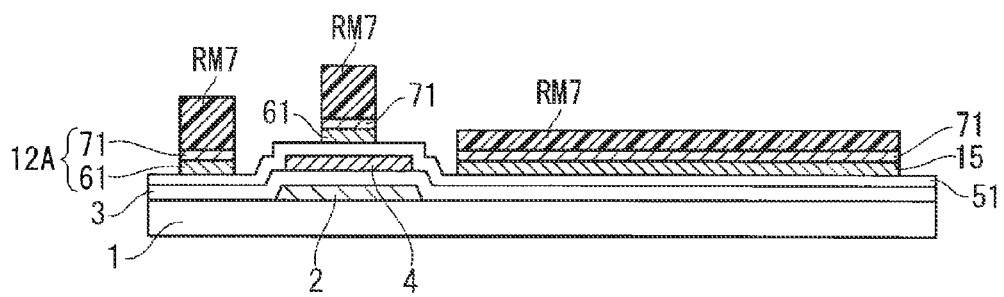
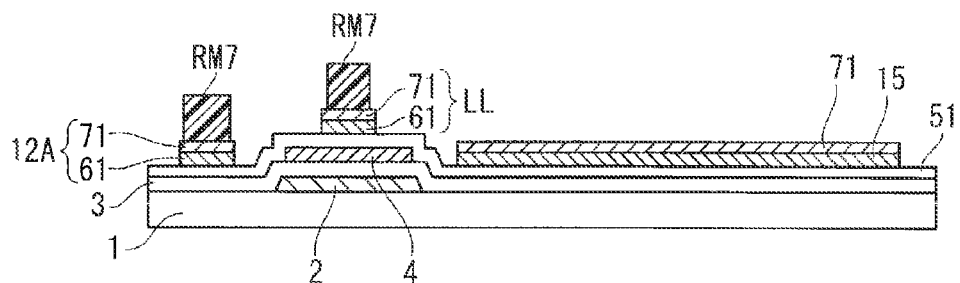

F I G. 5 4
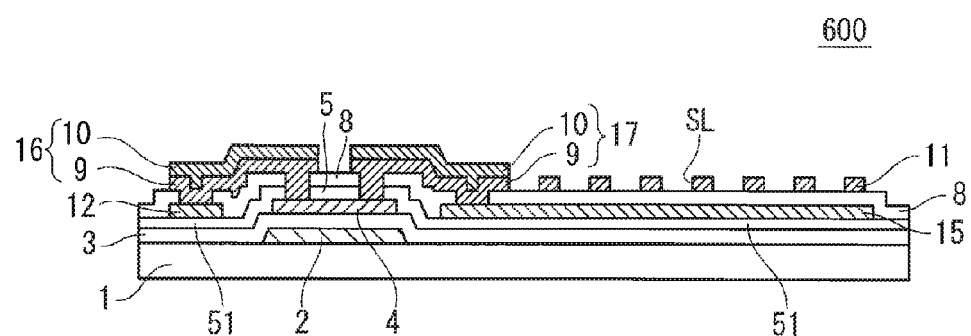

F I G. 5 6
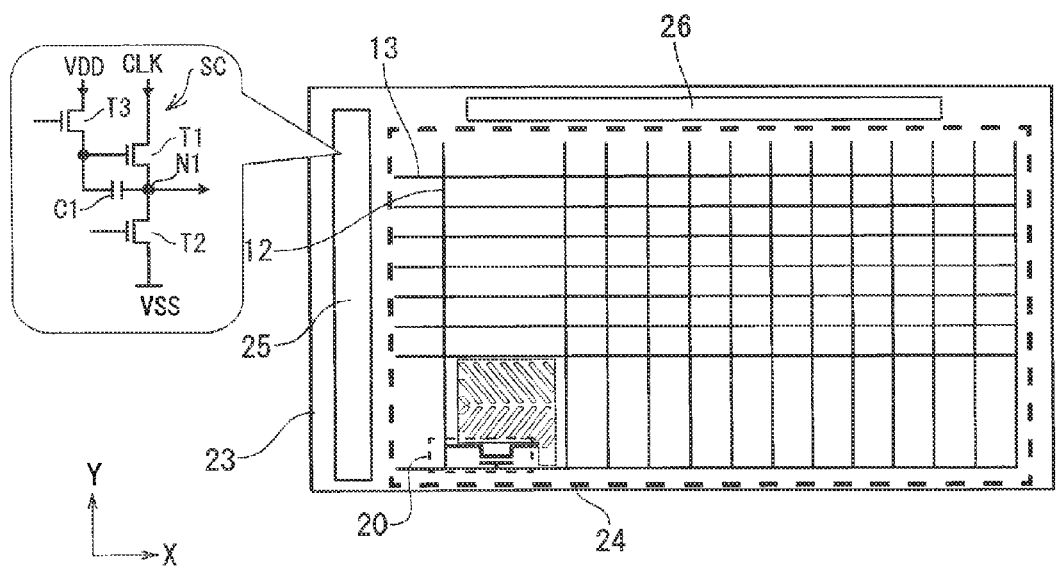
F I G. 5 7
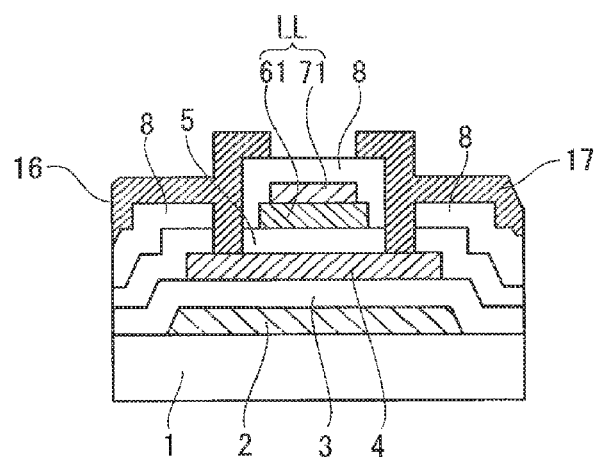

THIN-FILM TRANSISTOR SUBSTRATE, THIN-FILM TRANSISTOR SUBSTRATE MANUFACTURING METHOD, AND LIQUID CRYSTAL DISPLAY

TECHNICAL FIELD

The present invention relates to a thin-film transistor substrate constituting a liquid crystal display.

BACKGROUND ART

A TFT active matrix substrate (hereinafter, referred to as a "TFT substrate") using thin-film transistors (hereinafter, referred to as "TFTs") as switching devices is used for optoelectronic devices, for example, displays using liquid crystals (liquid crystal displays: hereinafter, referred to as "LCDs") and the like.

Liquid crystal displays (LCDs) are widely used for monitors of personal computers, portable information terminal devices, and the like, utilizing the advantages of low power consumption, compactness, and lightweight. In recent years, LCDs are widely used for television sets.

Generally, display modes of the LCD are roughly categorized into the TN (Twisted Nematic) mode and the lateral electric field mode represented by the in-plane switching mode and the FFS (Fringe Field Switching) mode. The liquid crystal display of the lateral electric field mode provides a feature of a wide viewing angle and a high contrast.

With respect to a liquid crystal display of the in-plane switching mode, display is performed by applying a lateral electric field to the liquid crystals held between opposing substrates, and pixel electrodes and a common electrode to which a lateral electric field is applied are provided on the same layer; thus, the liquid crystal molecules located right above the pixel electrodes are not sufficiently driven, whereby the transmittance is low.

On the other hand, in the FFS mode, because the common electrode and the pixel electrodes are disposed with an inter-layer insulating film therebetween, an oblique electric field (fringe electric field) is created, and an electric field in the lateral direction can be applied also to the liquid crystal molecules right above the pixel electrodes, whereby the liquid crystal molecules can be sufficiently driven. Therefore, a higher transmittance can be achieved at wide viewing angles than in the in-plane switching mode.

Further, in the liquid crystal display of the FFS mode, the liquid crystals are driven by the fringe electric field created between liquid crystal control slit electrodes and the pixel electrode disposed below the liquid crystal control slit electrodes with an inter-layer insulating film therebetween. In this configuration, a pixel aperture ratio can be prevented from being decreased when the pixel electrodes and the liquid crystal control slit electrodes are formed of an oxide-based transparent conductive film such as ITO (Indium Tin Oxide) containing indium oxide and tin oxide, or InZnO containing indium oxide and zinc oxide.

Further, because holding capacitors are formed by the pixel electrodes and the liquid crystal control slit electrodes, it is not always necessary to separately form a pattern for the holding capacitors within the pixels, differently from the liquid crystal display of the TN mode. This arrangement can achieve a high pixel aperture ratio.

Further, for switching devices of a TFT substrate for a liquid crystal display, amorphous silicon (a-Si) is conventionally used as a semiconductor material for a channel layer. Major reasons for that include the facts that a film having high uniform properties can be formed even on a large region substrate because amorphous silicon is amorphous and that, because a film can be formed at relatively low temperatures and the TFT substrate can be manufactured even on a low cost glass substrate whose thermal resistance is not good, the TFT substrate is highly suitable for liquid crystal displays for typical television sets.

However, in recent years, TFTs are being actively developed using an oxide semiconductor for a channel layer. The oxide semiconductor can stably provide an amorphous film having high uniformity when the composition is optimized, and has a higher mobility than conventional a-Si; therefore, the oxide semiconductor has an advantage that small-sized high-performance TFTs can be achieved. Therefore, application of such an oxide semiconductor film to a TFT substrate of the above FFS mode provides an advantage that it is possible to achieve an FFS mode TFT substrate having a higher pixel aperture ratio.

The TFT in which a-Si is used for a channel layer has a back channel etching (BCE) structure in which a channel region of the channel layer is exposed to wet etching when a source electrode and a drain electrode are formed. However, if an oxide semiconductor is applied to the BCE structure TFT, the oxide semiconductor is also etched by the wet etching of the source electrode and the drain electrode, whereby a channel cannot be formed.

To solve this problem, in Patent Document 1, an channel protective Si film is formed on an oxide semiconductor channel. With this configuration, the oxide semiconductor is not exposed to the wet etching, of the source electrode and the drain electrode, after forming the channel protective film, and it is thus possible to form the oxide semiconductor channel. Therefore, a TFT substrate can be configured by using TFTs whose channels are made of an oxide semiconductor.

PRIOR ART DOCUMENTS

Patent Documents

Patent Document 1: Japanese Laid-Open Patent Publication No. 2010-212672

SUMMARY OF INVENTION

Problems to be Solved by the Invention

As disclosed in Patent Document 1, when the channel protective film is provided, the channel can be formed without the oxide semiconductor being exposed to the etching of the source electrode and the drain electrode. However, the process for forming the channel protective film is necessary in addition to the process for forming the TFTs in the BCE structure. Such an increase of a formation process leads to an increase in production cost and a reduction in productivity. Further, there is created a parasitic capacitance at a crossing part between a source wiring and a gate wiring, and the parasitic capacitance is a cause of a signal delay on the source wiring and the like.

The present invention has been made to solve the above problems, and an object of the present invention is to provide a thin-film transistor substrate, where the number of manufacturing processes of the thin-film transistor substrate is not increased even in the case that the oxide semiconductor TFT has a channel protective film. An object of the preset invention is also to reduce the parasitic capacitance at a crossing part between the source wiring and the gate wiring.

Means for Solving the Problems

A thin-film transistor substrate according to the present invention is a thin-film transistor substrate which includes a matrix of a plurality of pixels, wherein each of the plurality of pixels includes: a thin-film transistor, the thin-film transistor including: a gate electrode provided on a substrate; a gate insulating film covering at least the gate electrode; a semiconductor layer provided at a position opposing the gate electrode with the gate insulating film between the semiconductor layer and the gate electrode; a channel protective film covering over at least the semiconductor layer; a protective film covering over at least the channel protective film; and a source electrode and a drain electrode respectively being in contact with the semiconductor layer through respective first contact holes provided to penetrate through the protective film and the channel protective film; a first electrode electrically connected to the drain electrode; a gate wiring extending from the gate electrode; and a source wiring electrically connected to the source electrode. The source wiring and the first electrode are respectively electrically connected to the source electrode and the drain electrode through respective second contact holes provided to penetrate through the protective film. The first electrode and the source wiring have a first transparent conductive film formed on the first insulation film. The first insulation film is formed of the same material as the channel protective film. The source electrode and the drain electrode are provided on a second insulation film made of the same material as the protective film, and each of the plurality of pixels includes a second electrode, which has a slit opening and is disposed at a position facing the first electrode, with the second insulation film between the first electrode and the second electrode. The semiconductor layer is formed of an oxide semiconductor.

Effects of the Invention

According to a thin-film transistor substrate according to the present invention, even in the case that an oxide semiconductor TFT has a channel protective film, the same mask can be used to form a channel protective film on a semiconductor layer and a contact hole through which a pixel electrode and a drain electrode are electrically connected to each other, and it is thus possible to prevent or reduce the increase of the number of manufacturing processes. Further, because a first electrode and a source wiring are formed on a first insulation film, the first electrode and the source wiring are allowed to be distant from the gate wiring. This arrangement can reduce a parasitic capacitance which is a cause of a signal delay on the source wiring. This advantageous effect is remarkable, in particular, at a crossing part between the source wiring and the gate wiring.

BRIEF DESCRIPTION OF DRAWINGS

FIG. 9 is a sectional view showing the manufacturing process of the TFT substrate of Embodiment 1 according to the present invention.

FIG. 10 is a sectional view showing the manufacturing process of the TFT substrate of Embodiment 1 according to the present invention.

FIG. 11 is a sectional view showing the manufacturing process of the TFT substrate of Embodiment 1 according to the present invention.

FIG. 12 is a sectional view showing the manufacturing process of the TFT substrate of Embodiment 1 according to the present invention.

FIG. 13 is a sectional view showing the manufacturing process of the TFT substrate of Embodiment 1 according to the present invention.

FIG. 14 is a sectional view showing the manufacturing process of the TFT substrate of Embodiment 1 according to the present invention.

FIG. 28 is a diagram showing a cross-sectional configuration of a pixel of a TFT substrate of Embodiment 3 according to the present invention.

FIG. 29 is a sectional view showing a manufacturing process of the TFT substrate of Embodiment 3 according to the present invention.

FIG. 30 is a sectional view showing the manufacturing process of the TFT substrate of Embodiment 3 according to the present invention.

FIG. 31 is a sectional view showing the manufacturing process of the TFT substrate of Embodiment 3 according to the present invention.

FIG. 54 is a diagram showing a cross-sectional configuration of a pixel of a TFT substrate of Embodiment 6 according to the present invention.

FIG. 56 is a plan view showing a general structure of a TFT substrate of Embodiment 7 according to the present invention.

FIG. 57 is a sectional view showing a configuration of a TFT constituting a drive voltage generation circuit.

DESCRIPTION OF EMBODIMENTS

A description will be given assuming that TFT substrates according to Embodiments 1 to 7 are active matrix substrates in which thin-film transistors are used as switching devices. Note that the TFT substrates are used for flat panel displays (flat panel displays) such as liquid crystal displays (LCDs).

Embodiment 1

With reference to FIG. 1 to FIG. 20, a description will be given to a configuration and a manufacturing method of a TFT substrate 100 of Embodiment 1 according to the present invention.

<Configuration of Pixel of TFT Substrate>

First, with reference to FIG. 1 and FIG. 2, a description will be given to a TFT substrate of Embodiment 1, more specifically, a configuration of a TFT substrate of the FFS (Fringe Field Switching) mode for an LCD. Note that, although the present invention relates to a TFT substrate, the configuration of a pixel is mainly described, because the configuration of a pixel especially has a feature.

Figure 1:
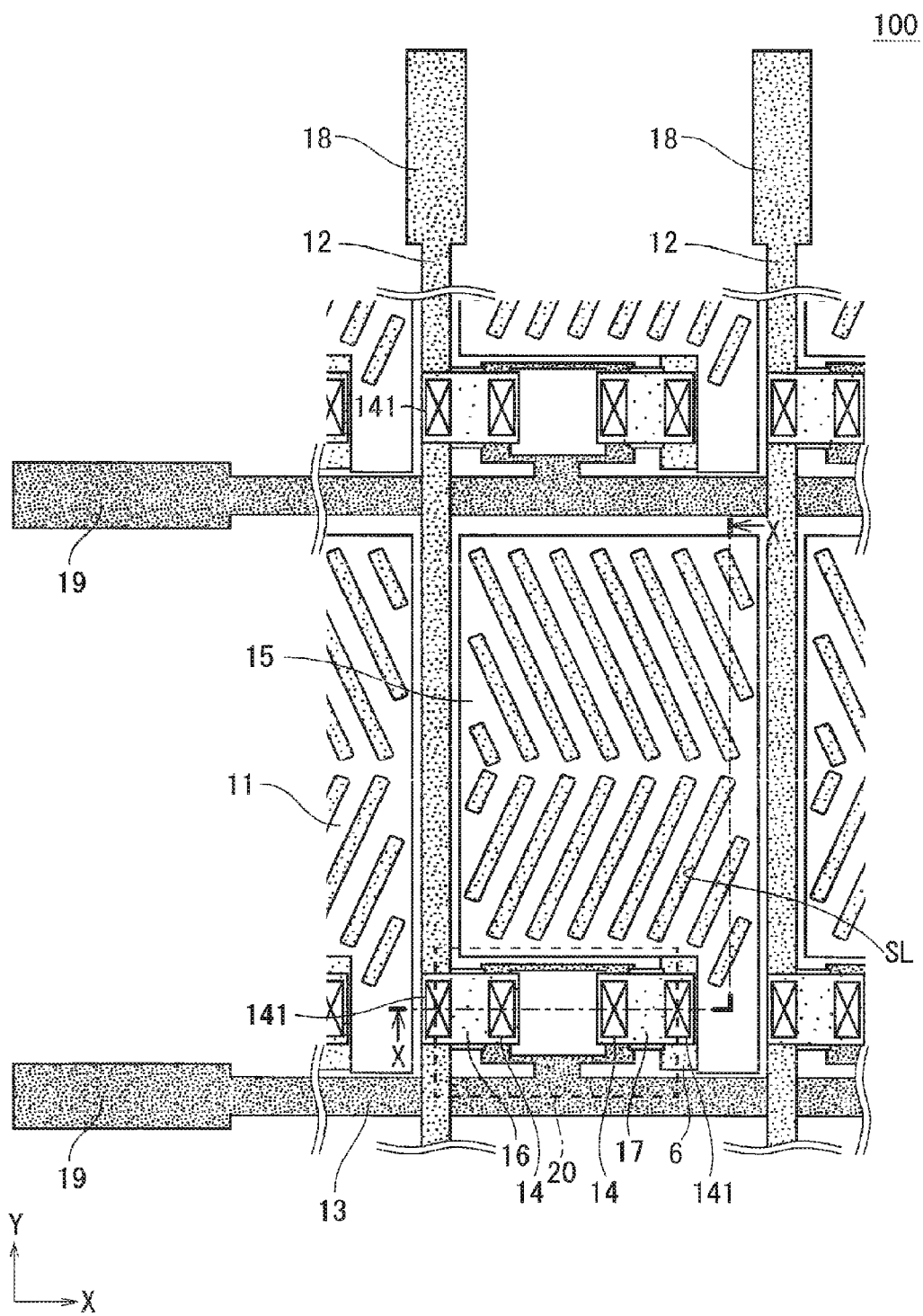
FIG. 1 is a diagram showing a planar configuration of a pixel of a TFT substrate of Embodiment 1 according to the present invention.
Figure 2:
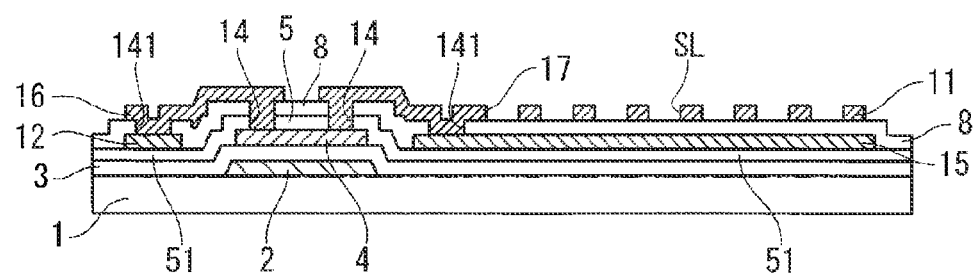
FIG. 2 is a diagram showing a cross-sectional configuration of the pixel of the TFT substrate of Embodiment 1 according to the present invention.

FIG. 1 is a plan view showing a configuration of a pixel part of the TFT substrate 100 according to Embodiment 1, and FIG. 2 is a sectional view showing a cross-sectional configuration (a cross-sectional configuration of a source wiring part, a TFT part, and an FFS transmissive pixel part) along line X-X in FIG. 1. Note that, in the following, a description is given assuming that the TFT substrate 100 is used for an FFS mode transmissive liquid crystal display.

As shown in FIG. 1, the TFT substrate 100 has a plurality of gate wirings 13 (scan signal lines) extending in the X direction and a plurality of source wirings 12 (display signal lines) extending in the Y direction, and the gate wirings 13 and the source wirings 12 are arranged to orthogonally intersect each other. In the vicinity of the intersections between the both wirings is provided a TFT 20. A gate electrode 2 of the TFT 20 is connected to the gate wiring 13. A source electrode 16 of the TFT 20 is connected to a source wiring 12 through a contact hole 141 (second contact hole). A drain electrode 17 of the TFT 20 is connected to a pixel electrode 15 through a contact hole 141 (second contact hole).

Further, in the TFT 20, a part branches from the gate wiring 13 and extends to a region (TFT part) in which the TFT 20 is formed, and the part constitutes the gate electrode 2 having a rectangular shape in a plan view. Above the gate electrode, there is formed a semiconductor layer (not shown) to overlap the gate electrode via a gate insulating film (not shown). Further, the two sides, of the region of the semiconductor layer functioning as a channel region, in the X direction each make a source region and a drain region, and the source region and the drain region respectively are connected to the source electrode 16 and the drain electrode 17 through the contact holes 14 (first contact holes).

Note that a region surrounded by the neighboring gate wirings 13 and the neighboring source wirings 12 is a pixel, and the pixel electrode 15 (first electrode) is formed in the region of the pixel except the region in which the TFT 20 is formed.

Further, above the pixel electrode 15, a liquid crystal control slit electrode 11 (second electrode) is provided to be opposed to almost the entire surface of the pixel electrode 15. In the entire surface of the liquid crystal control slit electrode 11, a plurality of slits SL is formed to be arranged, and the arrangement direction is along the X direction, but the respective slits SL are formed to be inclined such that the long sides are inclined with respect to the Y direction by a predetermined angle. Note that a common voltage is applied to the liquid crystal control slit electrode 11.

In Embodiments 1 to 7, the second electrode having the slits SL is the liquid crystal control slit electrode 11, and the first electrode is the pixel electrode 15. This is because a display voltage is applied to the first electrode. However, in a configuration in which a common voltage is applied to the first electrode and a display voltage is applied to the second electrode, the second electrode is referred to as a pixel electrode, and the first electrode is referred to as a common electrode.

Further, in FIG. 1, one end parts of the gate wirings 13 extending in the lateral direction (X direction) are electrically connected to gate terminals 19, and one end parts of the source wirings 12 extending in the vertical direction (Y direction) are electrically connected to source terminals 18.

Next, the cross-sectional configuration is described. As shown in FIG. 2, the TFT substrate 100 is formed on, for example, a transparent insulating substrate 1 such as glass, and on the transparent insulating substrate 1, the gate electrode 2 is formed of a first metal film. Note that, on the transparent insulating substrate 1, the gate wiring 13 (not shown) is also formed, and the gate electrode 2 is connected to the gate wiring 13.

Further, a gate insulating film 3 is formed entirely over the transparent insulating substrate 1 to coat the gate electrode 2. In a partial region of the gate insulating film 3, a semiconductor layer 4 is formed to overlap the gate electrode 2. In this arrangement, a part of the semiconductor layer 4 may be in a region outside the region above the gate electrode 2.

With respect to the semiconductor layer 4, a channel protective film 5 is formed on a region which functions as a channel region when the TFT 20 operates. Further, on a silicon oxide film 51 (first insulation film), which is made of the same material as the channel protective film 5, the source wiring 12 and the pixel electrode 15 are formed of a first transparent conductive film. Note that, in the following, the regions in which the source wiring 12, the pixel electrode 15, and the channel protective film 5 are formed are respectively referred to as a first region, a second region, and a third region, in some cases.

Further, a protective film 8 (second insulation film) is formed so as to cover the channel protective film 5, the source wiring 12, and the pixel electrode 15.

On the protective film 8, the source electrode 16 and the drain electrode 17 are formed of a second transparent conductive film and are electrically connected to the semiconductor layer 4 through the contact holes 14 penetrating through the protective film 8 and the channel protective film 5 to the semiconductor layer 4.

Further, the source electrode 16 extends to the position over the source wiring 12 and is electrically connected to the source wiring 12 through the contact hole 141 penetrating through the protective film 8 to the source wiring 12, and the drain electrode 17 extends to the position over the pixel electrode 15 and is electrically connected to the pixel electrode 15 through the contact hole 141 penetrating through the protective film 8 to the pixel electrode 15.

Further, on the protective film 8 on the pixel electrode 15, the liquid crystal control slit electrode 11 is formed, of the second transparent conductive film, as the same layer as the source electrode 16 and the drain electrode 17.

The region surrounded by the neighboring gate wirings 13 and the neighboring source wirings 12 is a pixel, and the pixel electrode 15 is formed on the pixel; thus, the TFT substrate 100 has a configuration in which pixels are arranged in a matrix.

Figure 3:
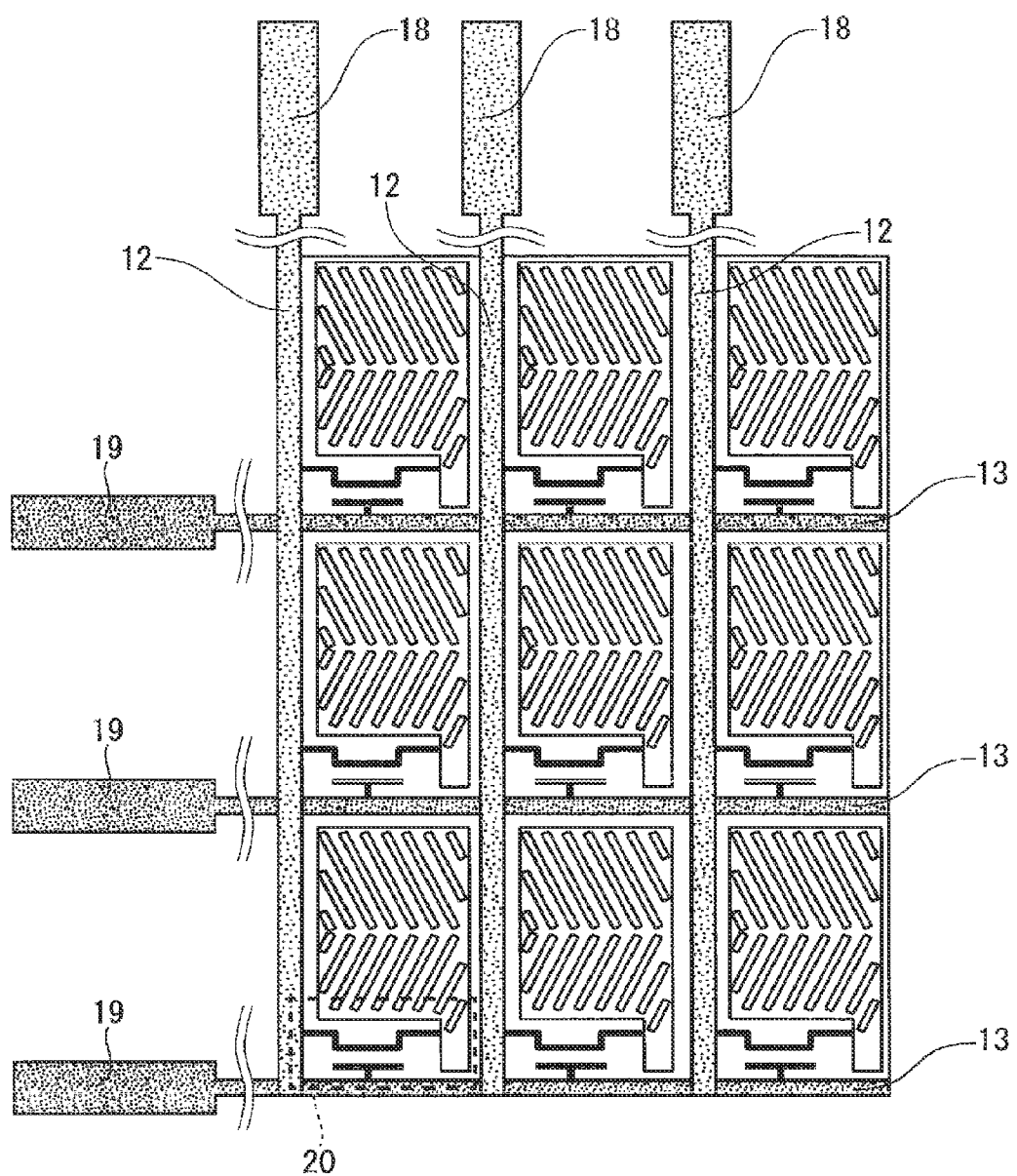
FIG. 3 is a plan view showing a part of a TFT substrate in which pixels are arranged in a matrix.

FIG. 3 shows a part of the TFT substrate 100 in which pixels are arranged in a matrix. In FIG. 3, the TFTs 20 are schematically depicted by transistor symbols.

Figure 4:
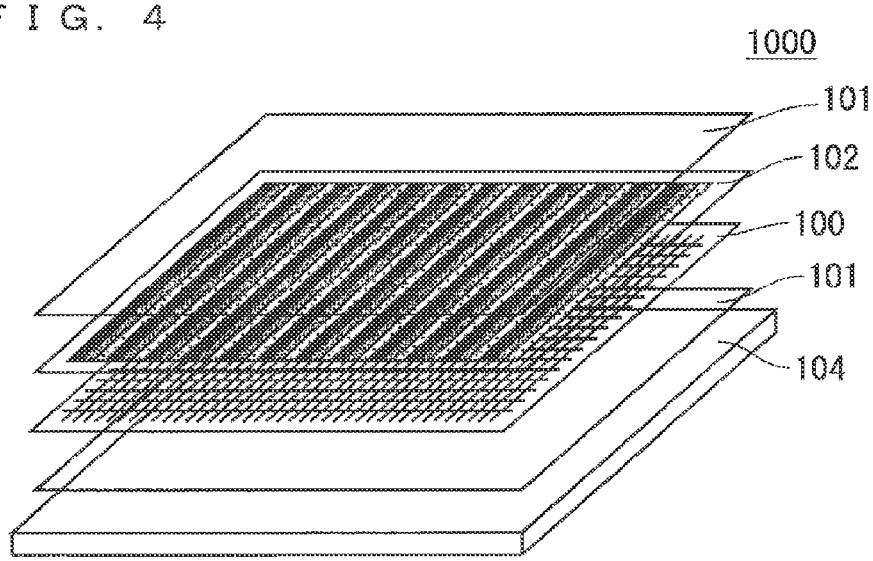
FIG. 4 is a diagram showing a configuration of a liquid crystal display.

Next, FIG. 4 shows a configuration of a liquid crystal display 1000 equipped with the TFT substrate 100. As shown in FIG. 4, the liquid crystal display 1000 is configured with a polarizer 101, the TFT substrate 100, a color filter 102, and a polarizer 101 disposed on a backlight 104 in this order, and the two polarizers 101 are disposed such that the polarization directions of the polarizers 101 are perpendicular to each other.

<Manufacturing Method>

Hereinafter, a manufacturing method of the TFT substrate 100 of Embodiment 1 will be described with reference to FIG. 5 to FIG. 20, which are sectional views sequentially showing the manufacturing process. Note that a sectional view showing the final step corresponds to FIG. 2.

Figure 5:
FIG. 5 is a sectional view showing a manufacturing process of a TFT substrate of Embodiment 1 according to the present invention.
Figure 6:
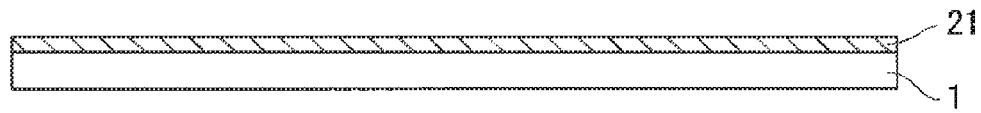
FIG. 6 is a sectional view showing the manufacturing process of the TFT substrate of Embodiment 1 according to the present invention.

First, in the step shown in FIG. 5, a transparent insulating substrate 1 made of glass or the like is prepared. Then, in the step shown in FIG. 6, entirely over the transparent insulating substrate 1, a first metal film 21 is formed of, for example, an aluminum (Al)-based alloy film, more specifically, an alloy film in which Ni of 3 mol % is added to Al (Al-3 mol % Ni film).

The Al-3 mol % Ni film is formed by a sputtering method using an Al-3 mol % Ni alloy target. In this step, an Al-3 mol % Ni film with a thickness of 100 nm is formed to constitute a first metal film 2. Note that, as a sputtering gas, Ar gas, Kr gas, or the like may be used.

Figure 7:
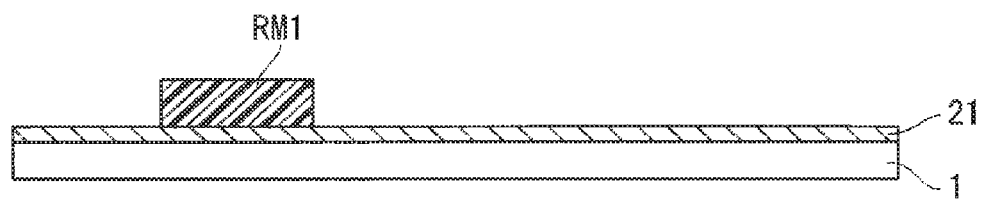
FIG. 7 is a sectional view showing the manufacturing process of the TFT substrate of Embodiment 1 according to the present invention.

Next, in the step shown in FIG. 7, a photoresist applied to the first metal film 21 is pattered by the first photolithography process so as to form a resist pattern RM1. The photoresist is formed to have a thickness of 1.5 μm in such a manner that photoresist material composed of, for example, novolac-based positive photosensitive resin is applied to the first metal film 21 by a coating method.

Figure 8:
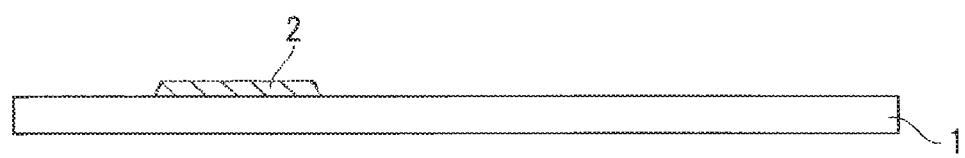
FIG. 8 is a sectional view showing the manufacturing process of the TFT substrate of Embodiment 1 according to the present invention.

Then, in the step shown in FIG. 8, the resist pattern RM1 is used as an etching mask to pattern the first metal film 21 by a wet etching method using PAN-based solution containing phosphoric acid, acetic acid, and nitric acid, whereby the gate electrode 2 is formed on the transparent insulating substrate 1. Note that the planar shape of the resist pattern RM1 is so set that the gate wiring 13 is formed simultaneously with the gate electrode 2.

Next, amine-based resist stripping liquid is used to strip and remove the resist pattern RM1, and then, in the step shown in FIG. 9, a silicon oxide (SiO) film 3 is formed entirely over the transparent insulating substrate 1 so as to cover the gate electrode 2 (and the gate wiring 13). This silicon oxide film 3 functions, on the gate electrode 2 of the TFT 20, as the gate insulating film 3.

The silicon oxide film 3 is formed to have a thickness of, for example, 50 nm to 500 nm by, for example, a plasma CVD (Chemical Vapor Deposition) method using silane ($SiH_4$) gas and dinitrogen monoxide ($N_2O$) gas.

Next, in the step shown in FIG. 10, a first semiconductor layer 41 is formed entirely over the silicon oxide film 3. In the present embodiment, as the first semiconductor layer 41, an InGaZnO-based oxide semiconductor is used in which gallium oxide ($Ga_2O_3$) and zinc oxide (ZnO) are added to indium oxide ($In_2O_3$).

In this embodiment, the first semiconductor layer 41 is formed by, for example, a DC sputtering method using an InGaZnO target—$In_2O_3 \cdot (Ga_2O_3) \cdot (ZnO)_2$—in which the atomic composition ratio of In, Ga, Zn, and O is 1:1:1:4. In this step, known argon (Ar) gas, krypton (Kr) gas, or the like may be used as the sputtering gas. The InGaZnO film formed by using such a sputtering method, the composition ratio of oxygen is lower than the stoichiometric composition, and the oxide film is in a state of oxygen ion deficiency (the composition ratio of O is less than 4 in the above example). Therefore, it is preferable to perform sputtering with oxygen ($O_2$) gas mixed in Ar gas. Here, the sputtering is performed by using mixed gas in which $O_2$ gas is added to Ar gas by a partial pressure ratio of 10%, whereby an InGaZnO-based oxide semiconductor having a thickness of, for example, 40 nm is formed. Note that the InGaZnO film may have an amorphous structure.

Next, in the step shown in FIG. 11, a photoresist applied and formed on the first semiconductor layer 41 is patterned by the second photolithography process so as to form a resist pattern RM2. The photoresist is formed to have a thickness of 1.5 μm by applying photoresist material composed of, for example, novolac-based positive photosensitive resin to the first semiconductor layer 41 by a coating method.

Then, in the step shown in FIG. 12, the resist pattern RM2 is used as an etching mask to pattern the first semiconductor layer 41 by a wet etching using solution containing nitric acid, whereby the semiconductor layer 4 is formed to overlap the gate electrode 2. In this arrangement the semiconductor layer 4 may have a region outside the region above the gate electrode 2. After that, amine-based resist stripping liquid is used to strip and remove the resist pattern RM2.

Next, in the step shown in FIG. 13, the silicon oxide film 51 is formed as the first insulation film entirely over the silicon oxide film 3 so as to cover the semiconductor layer 4. This silicon oxide film 51 functions, above the gate electrode 2 of the TFT 20, as the channel protective film 5.

The silicon oxide film 51 is formed to have a thickness, for example, approximately 50 nm to 300 nm by, for example, a plasma CVD method using silane ($SiH_4$) gas and dinitrogen monoxide ($N_2O$) gas.

Subsequently, a first transparent conductive film 61 is formed entirely over the silicon oxide film 51. This first transparent conductive film 61 is an amorphous ITO (a-ITO) film formed by a DC sputtering method using an ITO target containing, for example, indium oxide and tin oxide, and is formed to have a thickness of, for example, 100 nm.

Next, in the step shown in FIG. 14, a photoresist applied and formed to the first transparent conductive film 61 is patterned by the third photolithography process so as to form a resist pattern RM3 for forming the source wiring 12 and the pixel electrode 15. The photoresist is formed to have a thickness of 1.5 μm by applying photoresist material composed of, for example, novolac-based positive photosensitive resin to the first transparent conductive film 61 by a coating method.

Figure 15:
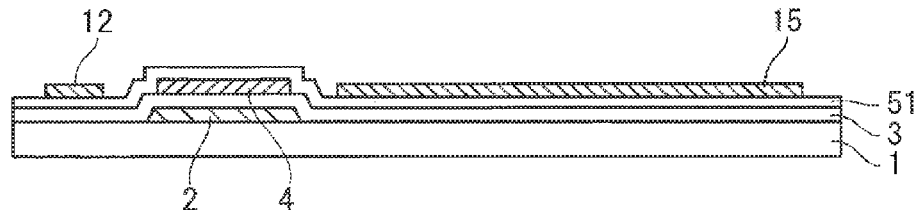
FIG. 15 is a sectional view showing the manufacturing process of the TFT substrate of Embodiment 1 according to the present invention.

In the step shown in FIG. 15, the resist pattern RM3 is used as an etching mask to etch the first transparent conductive film 61 by a wet etching method using PAN-based solution so as to form the source wiring 12 and the pixel electrode 15.

Figure 16:
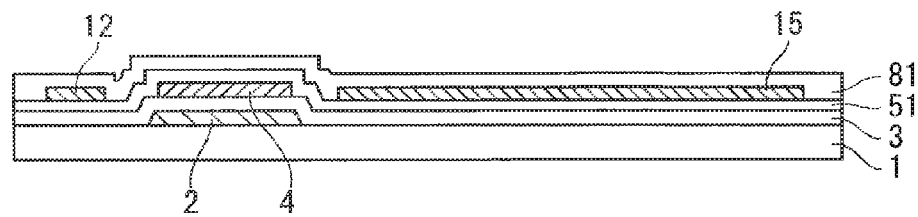
FIG. 16 is a sectional view showing the manufacturing process of the TFT substrate of Embodiment 1 according to the present invention.

Next, the resist pattern RM3 is stripped and removed by using amine-based resist stripping liquid, and then in the step shown in FIG. 16, a silicon oxide film 81 is formed as the second insulation film entirely over the silicon oxide film 51 so as to cover the source wiring 12 and the pixel electrode 15. This silicon oxide film 81 functions as the protective film 8.

The silicon oxide film 81 is formed to have a thickness, for example, 50 nm to 500 nm by, for example, a plasma CVD method using silane ($SiH_4$) gas and dinitrogen monoxide ($N_2O$) gas.

Figure 17:
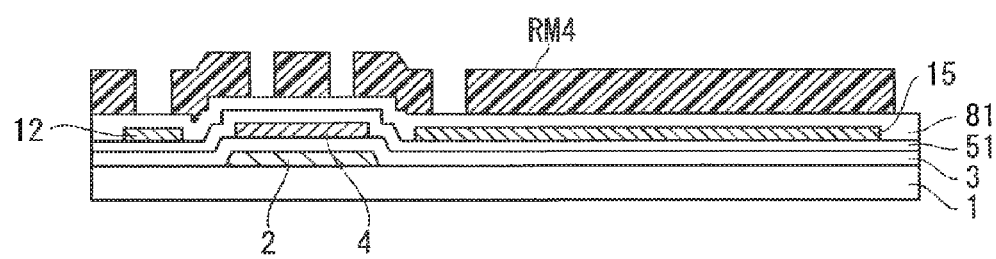
FIG. 17 is a sectional view showing the manufacturing process of the TFT substrate of Embodiment 1 according to the present invention.

Next, in the step shown in FIG. 17, a photoresist applied and formed to the silicon oxide film 81 is patterned by the fourth photolithography process so as to form a resist pattern RM4 for forming the contact holes 14 and 141. The photoresist is formed to have a thickness of 1.5 μm by applying photoresist material composed of, for example, novolac-based positive photosensitive resin to the first transparent conductive film 61 by a coating method.

Figure 18:
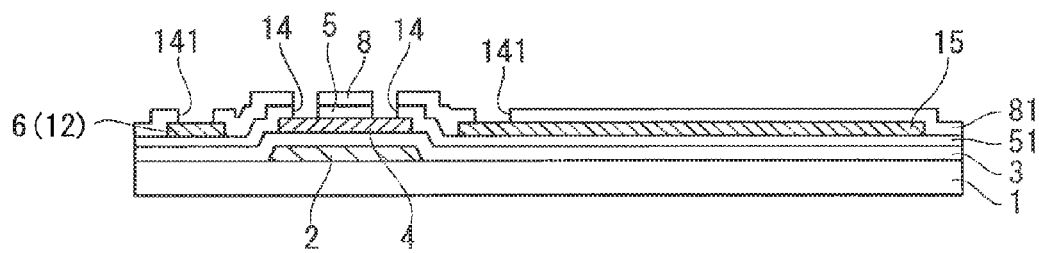
FIG. 18 is a sectional view showing the manufacturing process of the TFT substrate of Embodiment 1 according to the present invention.

Then, in the step shown in FIG. 18, the resist pattern RM4 is used as an etching mask to etch the silicon oxide film 81 by a dry etching method using gas containing fluorine such as $CHF_3$, $CF_4$, and $SF_6$ and oxygen ($O_2$) gas so as to form the contact holes 141 reaching the upper surfaces of the source wiring 12 and the pixel electrode 15. In addition, by continuing the etching after the contact holes 141 are formed, the silicon oxide film 51 is also etched above the semiconductor layer 4, whereby the contact holes 14 are formed to reach the upper surface of the semiconductor layer 4. This dry etching process forms the channel protective film 5 and the protective film 8.

Figure 19:
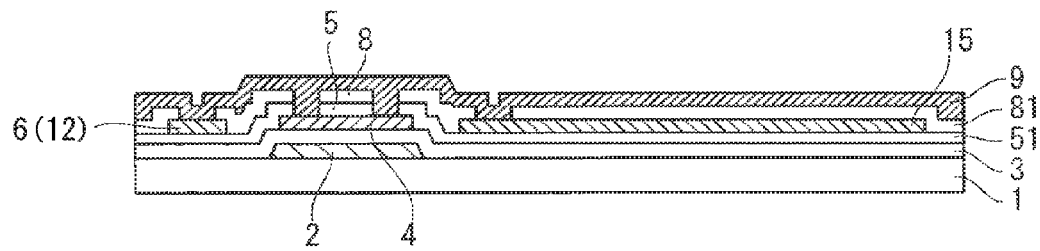
FIG. 19 is a sectional view showing the manufacturing process of the TFT substrate of Embodiment 1 according to the present invention.

Next, the resist pattern is stripped and removed by using amine-based resist stripping liquid, and then in the step shown in FIG. 19, the second transparent conductive film 9 is formed entirely over the silicon oxide film 81 including the protective film 8, whereby the contact holes 14 and 141 are filled.

This second transparent conductive film 9 is an a-ITO film, formed by, for example, a DC sputtering method using an ITO target containing indium oxide and tin oxide, and is formed to have a thickness of, for example, 100 nm.

Figure 20:
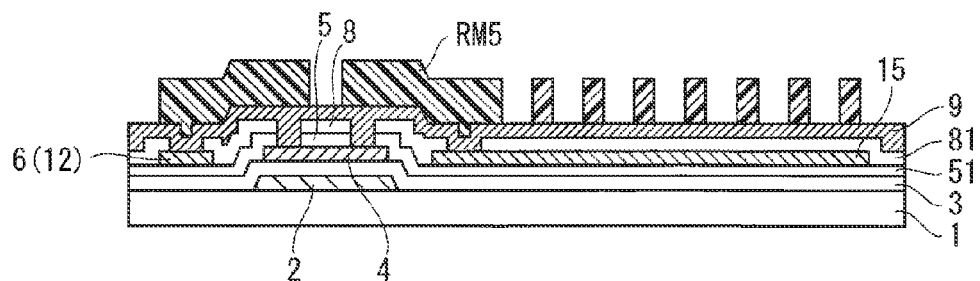
FIG. 20 is a sectional view showing the manufacturing process of the TFT substrate of Embodiment 1 according to the present invention.

Next, in the step shown in FIG. 20, a photoresist applied and formed on the second transparent conductive film 9 is patterned by the fifth photolithography process so as to form a resist pattern RM5 for forming the source electrode 16, the drain electrode 17, and the liquid crystal control slit electrode 11. The photoresist is formed to have a thickness of 1.5 µm by applying photoresist material composed of, for example, novolac-based positive photosensitive resin to the second transparent conductive film 9 by a coating method.

Then, the resist pattern RM5 is used as an etching mask to etch the second transparent conductive film 9 by a wet etching method using PAN-based solution so as to form the source electrode 16, the drain electrode 17, and the liquid crystal control slit electrode 11, whereby the TFT substrate 100 shown in FIG. 2 is obtained.

Note that an alignment film and spacers are formed on the surface of the completed TFT substrate 100. The alignment film is a film for causing liquid crystals to align and is composed of polyimide or the like.

In this embodiment, the color filter 102 shown in FIG. 4 is provided actually on a counter substrate to be disposed to face the TFT substrate 100. The TFT substrate 100 and the counter substrate are bonded to each other having a predetermined gap therebetween created by the above spacers, and this gap is filled with liquid crystals and is sealed. That is, a liquid crystal layer is held between the TFT substrate 100 and the counter substrate. On the outer sides of the thus bonded TFT substrate 100 and counter substrate, the two polarizers 101 and the backlight 104 shown in FIG. 4 are disposed, whereby the FFS mode liquid crystal display 1000 can be obtained.

The thus obtained liquid crystal display 1000 has features of a high resolution, a high frame rate, a long service life, and a high reliability.

Effects

For example, in the transistor disclosed in Patent Document 1, an Si channel protective film is formed on the channel of an oxide semiconductor, and if the transistor is employed as a TFT of a TFT substrate for a liquid crystal display, the following seven photolithography process are required.

Specifically, the seven photolithography processes are required for the steps: (1) patterning of a gate electrode; (2) patterning of a pixel electrode; (3) patterning of an oxide semiconductor; (4) patterning of a channel protective film; (5) patterning of a source electrode and a drain electrode; (6) forming of contact holes in the channel protective film; and (7) patterning of a liquid crystal control slit electrode.

However, in the TFT substrate 100 of Embodiment 1 according to the present invention, the source wiring 12 and the pixel electrode 15 are simultaneously formed by a single photolithography process, and the channel protective film 5 and the protective film 8 are simultaneously formed by a single photolithography process.

Further, because the source electrode 16, the drain electrode 17, and the liquid crystal control slit electrode 11 can be patterned by a single photolithography process, five photolithography processes can provide the TFT substrate 100. Therefore, even in the case that the oxide semiconductor TFT has a channel protective film, an increase in the number of manufacturing processes can be prevented.

Further, because the source electrode 16, the drain electrode 17, and the liquid crystal control slit electrode 11 are formed by the second transparent conductive film, the aperture ratio can be high.

An oxide semiconductor is used for a channel layer, and a TFT can therefore be manufactured to have a high mobility. Further, because the oxide semiconductor is hard to be etched by dry etching, the channel protective film 5 and the protective film 8 can be easily manufactured.

Further, the source wiring 12 and the pixel electrode 15 are formed on the silicon oxide film 51 (the first insulation film), the source wiring 12 and the pixel electrode 15 can be distant from the gate wiring 13. This arrangement can reduce a parasitic capacitance which causes a signal delay on the source wiring 12, pixel burn-in, and display unevenness. This effect is remarkable In particular at a crossing part between the source wiring 12 and the gate wiring 13. In addition, this effect is effective for LCDs of not only the FFS mode but also the TN mode and the IPS mode.

Embodiment 2

With reference to FIG. 21 to FIG. 27, a description will be given to a configuration and a manufacturing method of a TFT substrate 200 of Embodiment 2 according to the present invention.

<Cross-Sectional Configuration of TFT Substrate>

Figure 21:
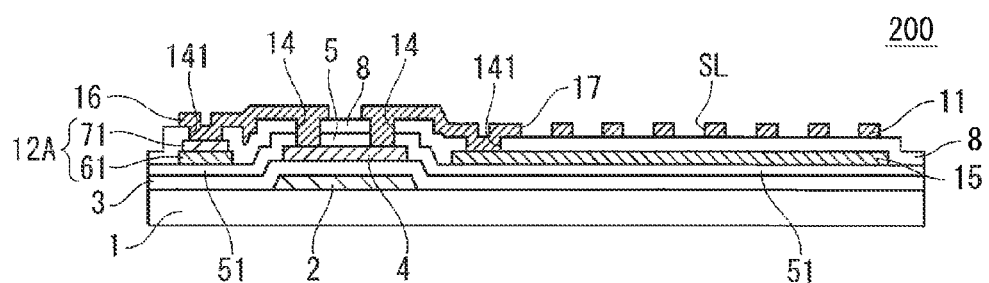
FIG. 21 is a diagram showing a cross-sectional configuration of a pixel of a TFT substrate of Embodiment 2 according to the present invention.

FIG. 21 is a sectional view corresponding to the cross-sectional configuration of the pixel part of the TFT substrate 100, according to Embodiment 1, described with reference to FIG. 2; therefore, the components which are the same as in the TFT substrate 100 are assigned the same reference codes, and redundant descriptions thereof are omitted.

As shown in FIG. 21, the TFT substrate 200 is different from the TFT substrate 100 in that a source wiring 12A is constituted by a laminated film in which a second metal film 71 is laminated on the first transparent conductive film 61.

<Manufacturing Method>

Hereinafter, a manufacturing method of the TFT substrate 200 of Embodiment 2 is described with reference to FIG. 22 to FIG. 27, which are sectional views sequentially showing the manufacturing process. Note that a sectional view showing the final step corresponds to FIG. 21.

Figure 22:
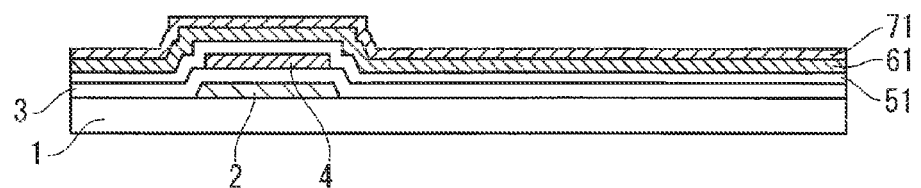
FIG. 22 is a sectional view showing a manufacturing process of the TFT substrate of Embodiment 2 according to the present invention.

First, after the first transparent conductive film 61 is formed entirely over the silicon oxide film 51 through the steps described in Embodiment 1 with reference to FIG. 5 to FIG. 13, the second metal film 71 is formed, in the step shown in FIG. 22, of Al-3 mol % Ni film to have a thickness of 100 nm by a sputtering method entirely over the first transparent conductive film 61.

Figure 23:
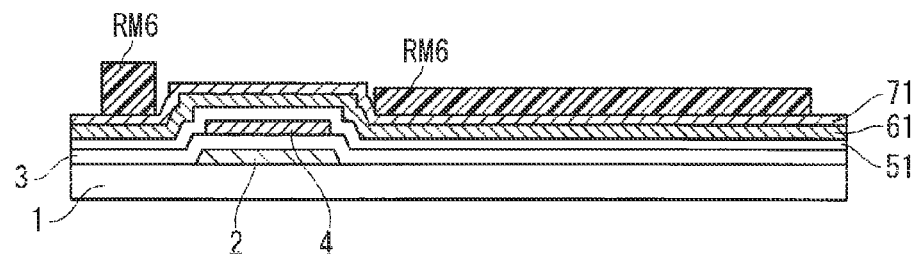
FIG. 23 is a sectional view showing the manufacturing process of the TFT substrate of Embodiment 2 according to the present invention.

Next, in the step shown in FIG. 23, a photoresist applied and formed on the second metal film 71 is patterned by the third photolithography process so as to form a resist pattern RM6 for forming the source wiring 12A and the pixel electrode 15. The photoresist is formed to have a thickness of 1.5 µm by applying photoresist material composed of, for example, novolac-based positive photosensitive resin to the second metal film 71 by a coating method. Then, the photoresist is exposed and developed by, for example, a halftone method, whereby the resist pattern RM6 is formed to have two different thicknesses.

The halftone method is a photolithography method in which a photoresist is exposed by using a multi-gradation photomask which has, in addition to an exposure light passing region and an exposure light blocking region, an intermediate exposure region through which exposure light passes through with 40% to 60% of light intensity being attenuated; and in the case of positive photoresist material, the photoresist is not fully exposed in a region under the intermediate exposure in which the intensity of the exposure light is low, whereby a resist pattern is formed in which the thickness is thinner than in the unexposed region.

That is, by using the halftone method, the resist pattern RM6 can be formed which has a first thickness (approximately 1.5 µm), which is the thickest, on the region which will be later the source wiring 12A of the TFT 20 and which has a second thickness, which is about half the first thickness, in the region which will be later the pixel electrode 15.

Figure 24:
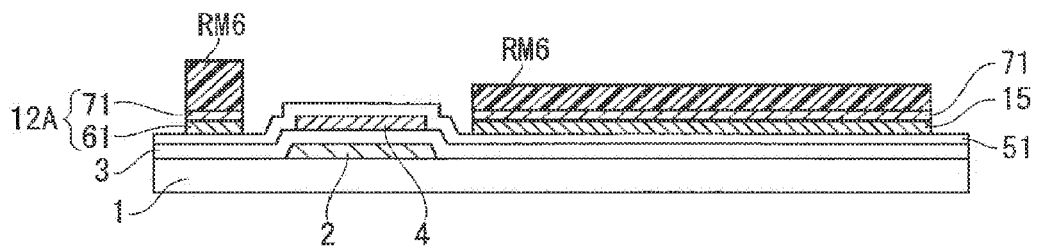
FIG. 24 is a sectional view showing the manufacturing process of the TFT substrate of Embodiment 2 according to the present invention.

Then, in the step shown in FIG. 24, the resist pattern RM6 is used as an etching mask to remove, by a wet etching method using PAN-based solution, the second metal film 71 (Al-3 mol % Ni film) and the first transparent conductive film 61 (a-ITO film) in the region other than the regions in which the source wiring 12A and the pixel electrode 15 will be formed later, whereby the source wiring 12A and the pixel electrode 15 are patterned.

Figure 25:
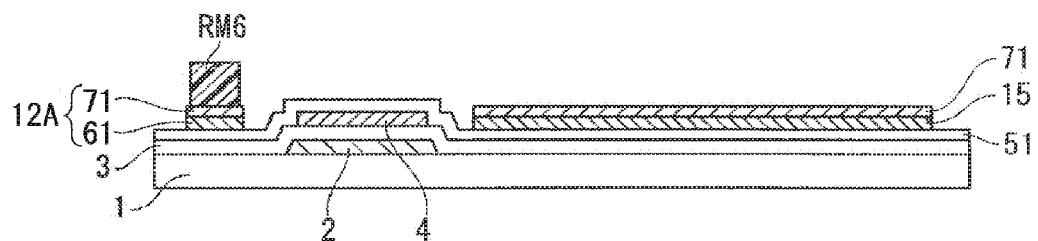
FIG. 25 is a sectional view showing the manufacturing process of the TFT substrate of Embodiment 2 according to the present invention.

Next, in the step shown in FIG. 25, the thickness of the resist pattern RM6 is reduced as a whole by ashing with oxygen plasma so that the part having a thinner film thickness can be perfectly removed so as to make the second metal film 71 on the pixel electrode 15 be exposed and that the resist pattern RM6 can be left on the source wiring 12A.

Next, an annealing treatment is performed to reform the pixel electrode 15 and the source wiring 12A, which are a-ITO films, into polycrystalline ITO (poly-ITO) films having resistance to PAN-based solution.

Figure 26:
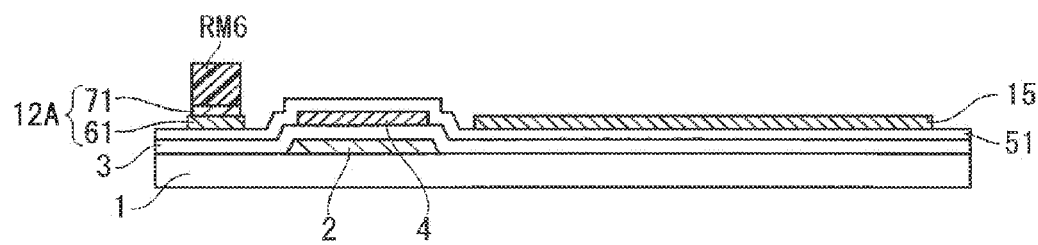
FIG. 26 is a sectional view showing the manufacturing process of the TFT substrate of Embodiment 2 according to the present invention.

Then, in the step shown in FIG. 26, wet etching is performed in the state that the resist pattern is left on the source wiring 12A, whereby the second metal film 71 is left on the source wiring 12A but the second metal film 71 on the pixel electrode 15 is removed. Note that the wet etching is performed by using PAN-based solution in this case, and the pixel electrode 15, which has become a poly-ITO film, is not removed but left.

Figure 27:
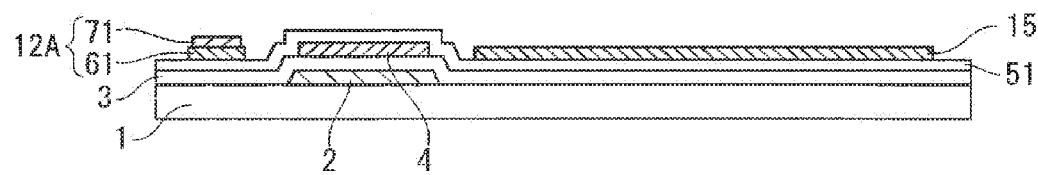
FIG. 27 is a sectional view showing the manufacturing process of the TFT substrate of Embodiment 2 according to the present invention.

After the resist pattern RM6 is stripped and removed by using amine-based resist stripping liquid in the step shown in FIG. 27, the steps described with reference to FIG. 16 to FIG. 20 in Embodiment 1 is performed to obtain the TFT substrate 200 shown in FIG. 21.

Effects

In the above-described TFT substrate 200 in Embodiment 2, the source wiring 12A is constituted by a laminated film in which the second metal film 71 is laminated on the first transparent conductive film 61; therefore, the wiring resistance can be reduced.

Further, when patterning the pixel electrode 15 and the source wiring 12A, the multi-gradation photomask is used to expose the photoresist so as to form the resist pattern RM6 having two different thicknesses, and the resist pattern is used to perform patterning, whereby the second metal film 71 can be left on the source wiring 12A.

Further, because the annealing treatment performs reformulation so as to make the pixel electrode 15 and the source wiring 12A, which are a-ITO films, into poly-ITO films having resistance to PAN-based solution, the pixel electrode 15 is prevented from being removed at the time of removing the second metal film 71.

Further, by the manufacturing method described with reference to FIG. 22 to FIG. 27, the TFT substrate 200 can be obtained through five photolithography processes.

Embodiment 3

With reference to FIG. 28 to FIG. 33, a description will be given to a configuration and a manufacturing method of a TFT substrate 300 of Embodiment 3 according to the present invention.

<Cross-Sectional Configuration of TFT Substrate>

FIG. 28 is a sectional view corresponding to the cross-sectional configuration of the pixel part of the TFT substrate 100 according to Embodiment 1 described with reference to FIG. 2; therefore, the same components as in the TFT substrate 100 are assigned the same reference codes, and redundant descriptions thereof are omitted.

As shown in FIG. 28, the TFT substrate 300 is different form the TFT substrate 100 in that the source wiring 12A is constituted by a laminated film in which the second metal film 71 is laminated on the first transparent conductive film 61 and that a laminated film LL constituted by the first transparent conductive film 61 and the second metal film 71 is formed also on the channel protective film 5 such that the laminated film LL is covered with a protective film 8.

In the TFT substrate 300, because the protective film 8 covers the first transparent conductive film 61 and the second metal film 71 on the channel protective film 5, it is prevented for the source electrode 16 and the drain electrode 17 from being electrically connected to each other.

In this arrangement, it is preferable that the source electrode 16 and the drain electrode 17 do not overlap above the first transparent conductive film 61 and the second metal film 71. This is because: if the second metal film 71 is formed on the channel protective film 5, parasitic capacitances which cause pixel burn-in and display unevenness are created between the source electrode 16 and the drain electrode 17 and the first transparent conductive film 61 and the second metal film 71; however, if the source electrode 16 and the drain electrode 17 do not overlap above the first transparent conductive film 61 and the second metal film 71, creation of such parasitic capacitances can be prevented or reduced, and at the same time, the second metal film 71 formed above the semiconductor layer 4 can reduce light entering the semiconductor layer 4.

<Manufacturing Method>

Hereinafter, a manufacturing method of the TFT substrate 300 of Embodiment 3 is described with reference to FIG. 29 to FIG. 33, which are sectional views sequentially showing the manufacturing process. Note that a sectional view showing the final step corresponds to FIG. 28.

First, after the steps described in Embodiment 1 with reference to FIG. 5 to FIG. 13 are performed, and after the first transparent conductive film 61 is formed entirely over the silicon oxide film 51, the second metal film 71 is formed of Al-3 mol % Ni film to have a thickness of 100 nm entirely over the first transparent conductive film 61 through the step described in Embodiment 2 with reference to FIG. 22.

Next, in the step shown in FIG. 29, a photoresist applied and formed on the second metal film 71 is patterned by the third photolithography process so as to form a resist pattern RM7 for forming the source wiring 12A, the pixel electrode 15, and the laminated film LL above the semiconductor layer 4. The photoresist is formed to have a thickness of 1.5 µm by applying photoresist material composed of, for example, novolac-based positive photosensitive resin to the second metal film 71 by a coating method. Then, the photoresist is exposed and developed by, for example, a halftone method, and the resist pattern RM7 is thus formed to have two different thicknesses.

That is, by using the halftone method, the resist pattern RM7 can be formed. The resist pattern RM7 has a first thickness (approximately 1.5 µm), which is the thickest, on the region which will be later the source wiring 12A of the TFT 20 and on the region which will be later the laminated film LL, and the resist pattern RM7 has a second thickness, which is about half the first thickness, in the region which will be later the pixel electrode 15.

Then, in the step shown in FIG. 30, the resist pattern RM7 is used as an etching mask to remove, by a wet etching method using PAN-based solution, the second metal film 71 (Al-3 mol % Ni film) and the first transparent conductive film 61 (a-ITO film) in the region other than the regions in which the source wiring 12A, the laminated film LL, and the pixel electrode 15 will be formed later, whereby the source wiring 12A, the laminated film LL, and the pixel electrode 15 are patterned.

Next, in the step shown in FIG. 31, the thickness of the resist pattern RM7 is reduced as a whole by ashing with oxygen plasma so that the part of the resist pattern having a thinner film thickness can be perfectly removed so as to make the second metal film 71 on the pixel electrode 15 be exposed and that the resist pattern RM7 can be left on the source wiring 12A and the laminated film LL.

Next, an annealing treatment is performed to reform the pixel electrode 15, the first conductive film 61 of the laminated film LL, and the source wiring 12A, which are a-ITO films, into polycrystalline ITO (poly-ITO) films having resistance to PAN-based solution.

Figure 32:
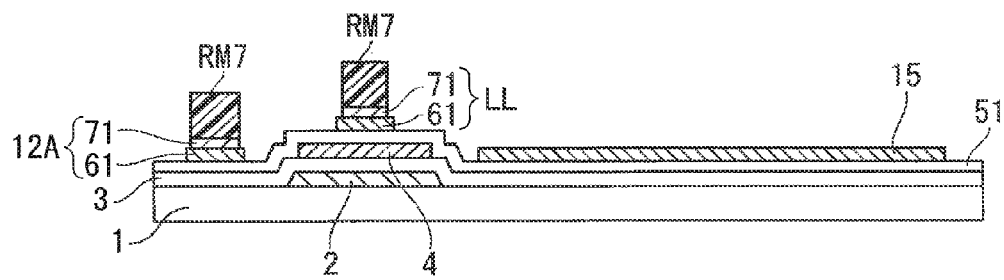
FIG. 32 is a sectional view showing the manufacturing process of the TFT substrate of Embodiment 3 according to the present invention.

Then, in the step shown in FIG. 32, wet etching is performed in the state that the resist pattern is left on the source wiring 12A and the laminated film LL, whereby the second metal film 71 is left on the source wiring 12A and the laminated film LL above the semiconductor layer 4 is left and the second metal film 71 on the pixel electrode 15 is removed.

Note that the wet etching is performed by using PAN-based solution in this case, and the pixel electrode 15, which has become a poly-ITO film, is not removed but left.

Figure 33:
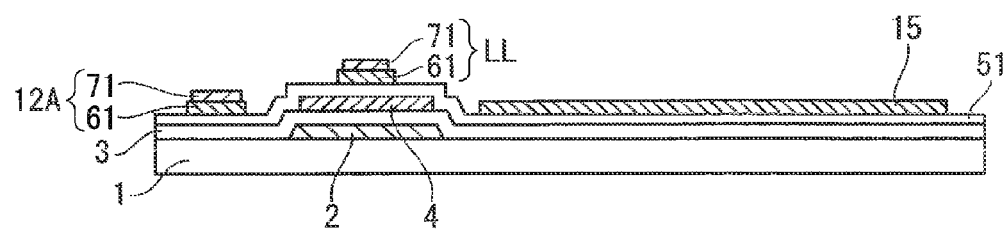
FIG. 33 is a sectional view showing the manufacturing process of the TFT substrate of Embodiment 3 according to the present invention.

After the resist pattern RM7 is stripped and removed by using amine-based resist stripping liquid in the step shown in FIG. 33, the TFT substrate 300 shown in FIG. 28 is obtained through the steps described with reference to FIG. 16 to FIG. 20 in Embodiment 1.

Effects

The TFT 20 is exposed to the light of the backlight 104 (FIG. 4) reflected by the color filter 102 (FIG. 4) or the like which is upper than the TFT substrate 300. If a threshold voltage of the TFT 20 is shifted by this radiation of light and exceeds a drive voltage of the gate, the TFT cannot normally operate.

However, because the laminated film LL having the second metal film 71 is provided above the channel region of the semiconductor layer 4, it is possible to reduce the light reflected by a layer upper than the TFT substrate 300 and entering the semiconductor layer 4 through the channel protective film 5, whereby it is possible to obtain a long-life and highly reliable TFT 20.

Figure 34:
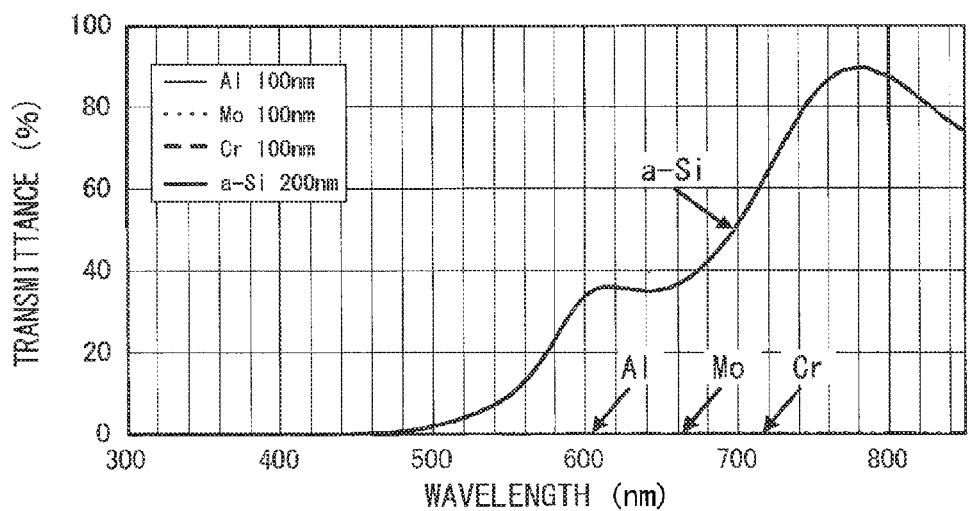
FIG. 34 is a diagram showing optical transmittance characteristics of an a-Si and a metal film.

Here, FIG. 34 shows transmittance characteristics of an a-Si having a film thickness of 200 nm and a metal film having a film thickness 100 nm for light of wavelengths.

FIG. 34 shows the respective transmittance characteristics of metal films of Al, molybdenum (Mo), chromium (Cr) and the transmittance characteristics of an a-Si film and shows that every metal film perfectly blocks light in the wavelength range from 500 nm to 800 nm. Note that because any of the metal films of Al, Mo, and Cr has a transmittance of almost zero, the characteristic lines are on the horizontal axis and cannot be identified in FIG. 34.

On the other hand, the a-Si film has a transmittance of at least several percent for the above wavelength range and has a transmittance of at most approximately 90 percent, and it is understood that a metal film can perfectly block light.

Further, because the source electrode 16 and the drain electrode 17 do not overlap above the first transparent conductive film 61 and the second metal film 71, creation of parasitic capacitances can be prevented or reduced, whereby it is possible to reduce pixel burn-in and display unevenness.

Further, by the manufacturing method described with reference to FIG. 29 to FIG. 33, the TFT substrate 300 can be obtained through five photolithography processes.

Modified Example

In the above-described Embodiment 3, a configuration is described in which the protective film 8 is formed of silicon oxide film; however, if the protective film 8 is formed of a multi-layer film including an organic planarizing film, the protective film 8 can be made thick easily. This arrangement makes longer the distances between the source electrode 16 and the drain electrode 17 on the protective film 8 and the second metal film 71 of the laminated film LL, and the parasitic capacitance can thus be further reduced.

Figure 35:
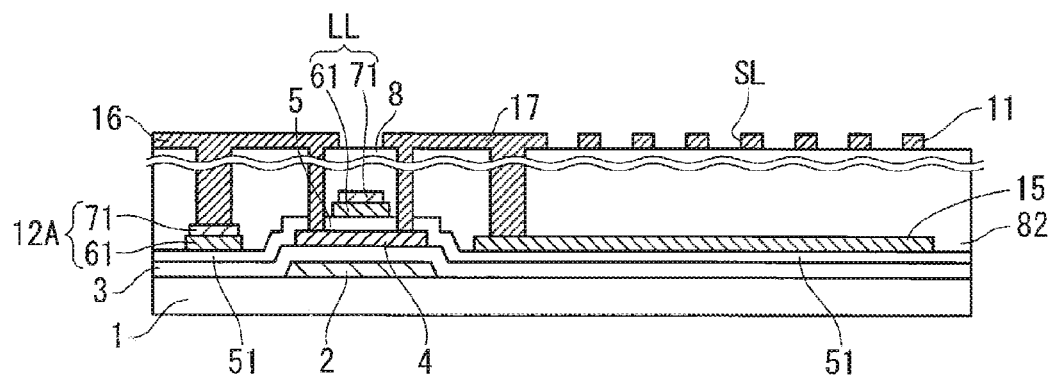
FIG. 35 is a diagram showing across-sectional configuration of a pixel of a TFT substrate of a modified example of Embodiment 3 according to the present invention.

FIG. 35 shows a configuration in which the protective film 8 is made thicker by using, instead of the silicon oxide film 81, a multi-layer film 82 including an organic planarizing film.

As shown in FIG. 35, when the multi-layer film 82 including an organic planarizing film having a thickness of 1.0 to 3.0 μm is formed on the silicon oxide film 51, it is possible to sufficiently planarize unevenness caused by the wirings and the like created by the manufacturing process, and the protective film 8 can thus be made thick easily.

Note that the organic planarizing film can be obtained by applying, for example, light-sensitive acrylic organic resin material by a spin coat method. Note that the material is not limited to acrylic organic resin material, and it is also possible to use olefin-based materials, novolac-based materials, polyimide materials, or siloxane materials.

Further, also in the configuration described in Embodiments 1 and 2, the protective film 82 including an organic planarizing film may be used, instead of the silicon oxide film 81, as the protective film 8. Using the multi-layer film 82 can make a thicker film easily.

Embodiment 4

With reference to FIG. 36 to FIG. 44, a description will be given to a configuration and a manufacturing method of a TFT substrate 400 of Embodiment 4 according to the present invention. The present Embodiment 4 has a configuration in which the configuration of the TFT substrate 300 described in Embodiment 3 is partially modified; therefore, the same components as in the TFT substrate 300 are assigned the same reference codes, and redundant descriptions thereof are omitted.

<Configuration of TFT Substrate>

Figure 36:
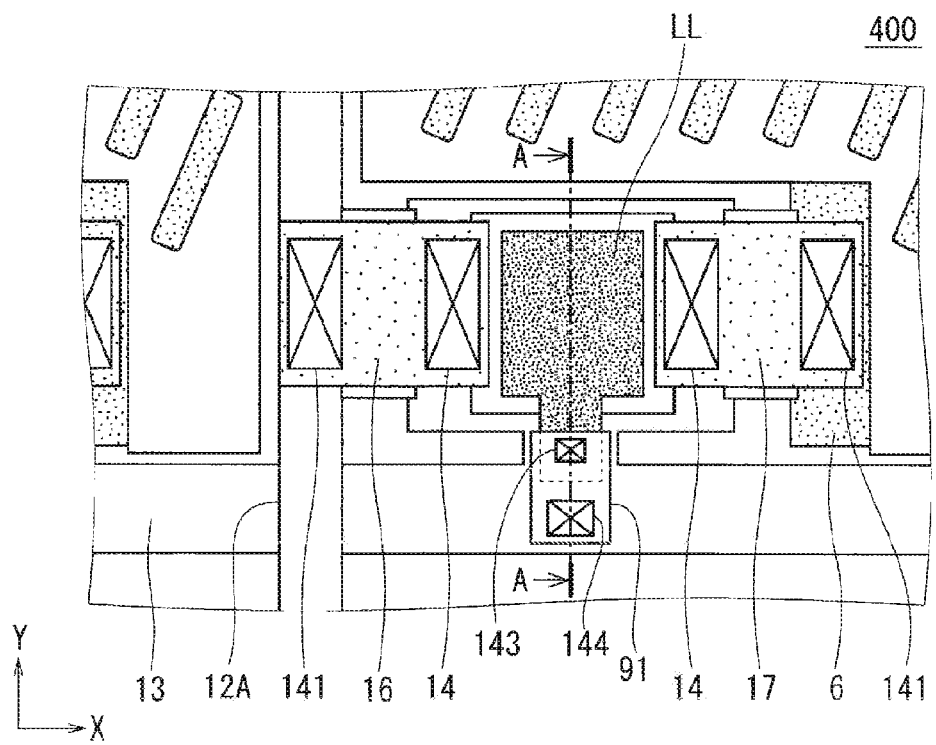
FIG. 36 is a diagram showing a partial planar configuration of a pixel of a TFT substrate of Embodiment 4 according to the present invention.
Figure 37:
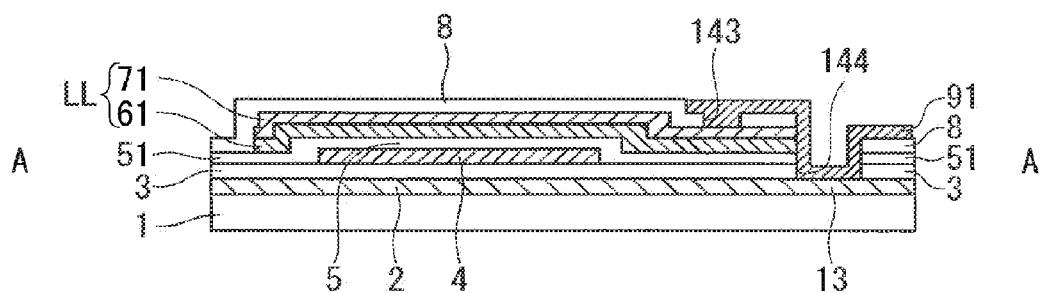
FIG. 37 is a diagram showing a cross-sectional configuration of the pixel of the TFT substrate of Embodiment 4 according to the present invention.

FIG. 36 is a partial plan view of a pixel part of the TFT substrate 400 of Embodiment 4, and FIG. 37 is a sectional view showing a cross-sectional configuration along line A-A in FIG. 36. As shown in FIG. 37, line A-A cuts, parallely to the Y direction, the gate wiring 13 and the gate electrode 2 branching from the gate wiring 13; and FIG. 37 shows the gate wiring 13 and the gate electrode 2 as a single layer.

Above the gate electrode 2 is provided a semiconductor layer 4 with a gate insulating film 3 therebetween, and on the semiconductor layer 4 is formed a channel protective film 5. Note that the channel protective film 5 is another name of a silicon oxide film 51 provided on the region which functions as a channel region when a TFT 20 operates, and is referred as a silicon oxide film 51 (the first insulation film) outside the region above the channel region.

As shown in FIG. 37, in the TFT substrate 400, a laminated film LL constituted by the first transparent conductive film 61 and the second metal film 71 is provided on the channel protective film 5 such that the laminated film 5 extends also from above the channel protective film 5 to above the silicon oxide film 51. That is, the laminated film LL is provided so as to extend from above the gate electrode 2 to above the gate wiring 13.

The laminated film LL is covered by the protective film 8, and the laminated film LL is configured to be electrically connected to the gate wiring 13 via a top gate conductive film 91 provided to fill a contact hole 143 (third contact hole) and a contact hole 144 (fourth contact hole), where the contact hole 143 penetrates through the protective film 8 on the laminated film LL, and the contact hole 144 penetrates through the protective film 8, the silicon oxide film 51, and the gate insulating film 3 on the gate wiring 13.

<Manufacturing Method>

Hereinafter, a manufacturing method of the TFT substrate 400 of Embodiment 4 is described with reference to FIG. 38 to FIG. 44, which are sectional views sequentially showing the manufacturing process. Note that a sectional view showing the final step corresponds to FIG. 37.

Figure 38:
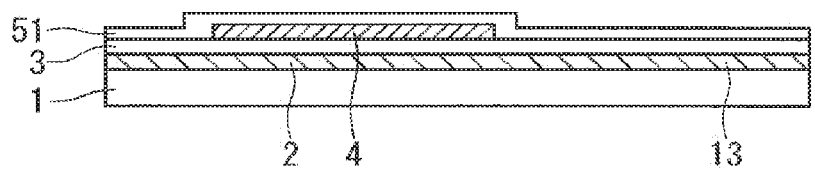
FIG. 38 is a sectional view showing a manufacturing process of the TFT substrate of Embodiment 4 according to the present invention.

First, after the steps described in Embodiment 1 with reference to FIG. 5 to FIG. 12 are performed, the silicon oxide film 51 is formed, in the step shown in FIG. 38, as the first insulation film on the silicon oxide film 3 so as to cover the semiconductor layer 4. This silicon oxide film 51 functions as the channel protective film 5, above the gate electrode 2 of the TFT 20. This step corresponds to the step described in Embodiment 1 with reference to FIG. 13, and the redundant description is omitted.

Figure 39:
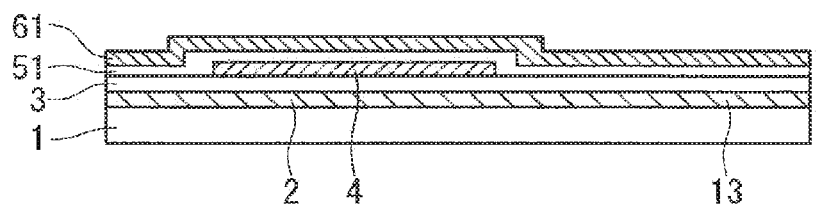
FIG. 39 is a sectional view showing the manufacturing process of the TFT substrate of Embodiment 4 according to the present invention.

Subsequently, in the step shown in FIG. 39, the first transparent conductive film 61 is formed entirely over the silicon oxide film 51. This step corresponds to the step described in Embodiment 1 with reference to FIG. 13, and a redundant description thereof is omitted.

Figure 40:
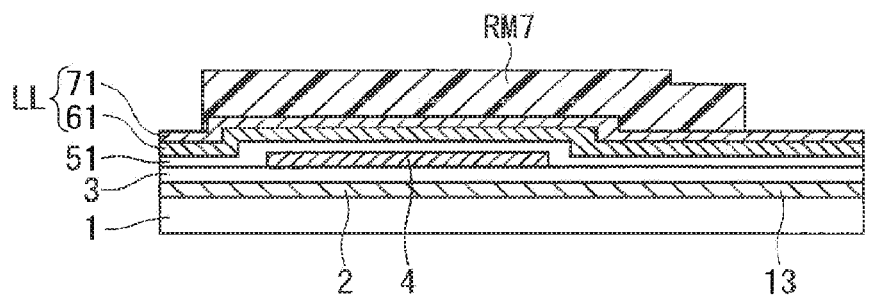
FIG. 40 is a sectional view showing the manufacturing process of the TFT substrate of Embodiment 4 according to the present invention.

Next, in the step shown in FIG. 40, the second metal film 71 is formed of an Al-3 mol % Ni film to have a thickness of 100 nm entirely over the first transparent conductive film 61 by a sputtering method, and then a photoresist applied and formed on the second metal film 71 is patterned by the third photolithography process so as to form a resist pattern RM7 for forming the laminated film LL above a source wiring 12A, the pixel electrode 15, and the semiconductor layer 4. This step corresponds to the step described in Embodiment 3 with reference to FIG. 29, and a redundant description thereof is omitted.

Note that the resist pattern RM7 is formed by exposing the photoresist by a halftone method, and resist pattern RM7 has a first thickness (approximately 1.5 μm) in the region above from the gate wiring 13 to above the gate electrode 2.

Figure 41:
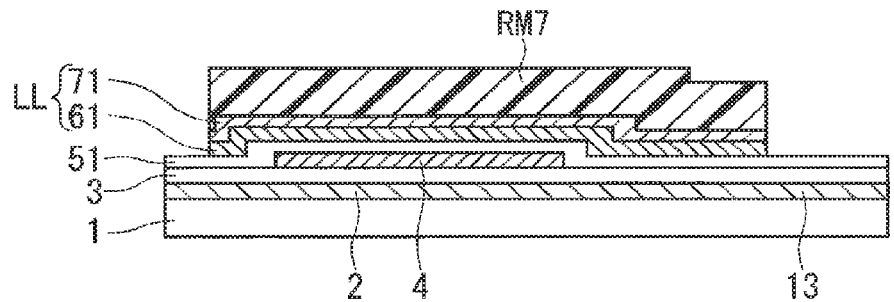
FIG. 41 is a sectional view showing the manufacturing process of the TFT substrate of Embodiment 4 according to the present invention.

Then, in the step shown in FIG. 41, the resist pattern RM7 is used as an etching mask to remove, by a wet etching method using PAN-based solution, the second metal film 71 (Al-3 mol % Ni film) and the first transparent conductive film 61 (a-ITO film) in the region other than the regions in which the source wiring 12A, the laminated film LL, and the pixel electrode 15 will be formed later, whereby the laminated film LL is patterned. In this step, the source wiring 12A and the pixel electrode 15 are also patterned. This step corresponds to the step described in Embodiment 3 with reference to FIG. 30.

Note that, after this step, there are a step for reducing the thickness of the resist pattern RM7 as a whole by ashing using oxygen plasma (the step described with reference to FIG. 31) and a step of an annealing treatment, but the description of these steps are omitted.

Figure 42:
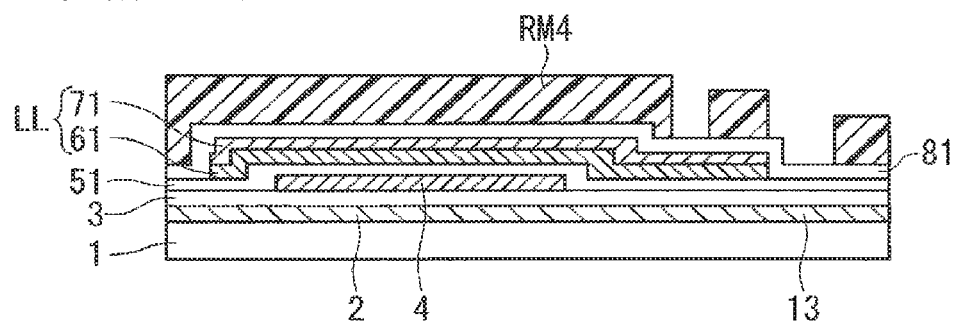
FIG. 42 is a sectional view showing the manufacturing process of the TFT substrate of Embodiment 4 according to the present invention.

Next, after the resist pattern RM7 is stripped and removed by using amine-based resist stripping liquid, a silicon oxide film 81 is formed as a second insulation film entirely over the silicon oxide film 51 so as to cover the laminated film LL in the step shown in FIG. 42. This silicon oxide film 81 functions as the protective film 8. This step corresponds to the step described in Embodiment 1 with reference to FIG. 16, and a redundant description thereof is omitted.

Next, in the step shown in FIG. 42, a photoresist applied and formed on the silicon oxide film 81 is patterned by the fourth photolithography process so as to form a resist pattern RM4 for forming the contact holes 143 and 144. This step corresponds to the step described in Embodiment 1 with reference to FIG. 17, and a redundant description thereof is omitted.

Figure 43:
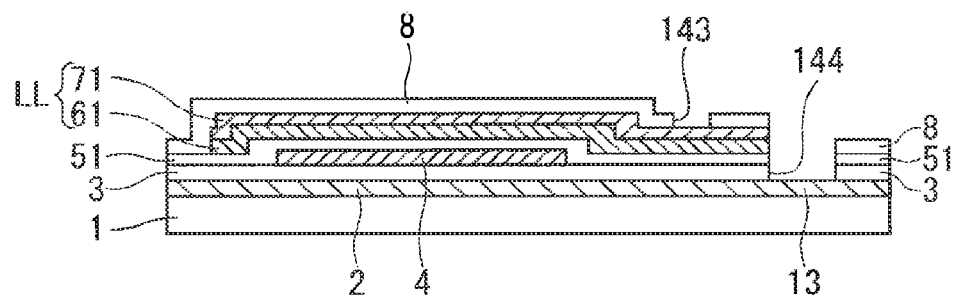
FIG. 43 is a sectional view showing the manufacturing process of the TFT substrate of Embodiment 4 according to the present invention.

Then, in the step shown in FIG. 43, the resist pattern RM4 is used as an etching mask to etch the silicon oxide film 81 by a dry etching method using gas containing fluorine such as $CHF_3$, $CF_4$, and $SF_6$ and oxygen ($O_2$) gas so as to form the contact holes 143 reaching the upper surface of the second metal film 71. In addition, the etching is continued after the contact holes 143 are formed, and also the silicon oxide film 51 and the gate insulating film 3 are etched above the gate wiring 13, whereby the contact holes 144 are formed to reach the upper surface of the gate wiring 13. This step corresponds to the step described in Embodiment 1 with reference to FIG. 18, and a redundant description thereof is omitted.

Figure 44:
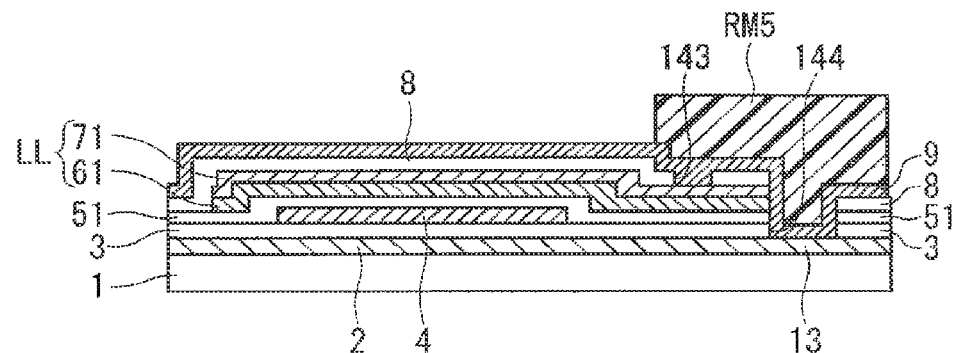
FIG. 44 is a sectional view showing the manufacturing process of the TFT substrate of Embodiment 4 according to the present invention.

Next, after the resist pattern RM4 is stripped and removed by using amine-based resist stripping liquid, a second transparent conductive film 9 is formed, in the step shown in FIG. 44, entirely over the silicon oxide film 81 including the protective film 8 so as to fill the contact holes 143 and 144. This step corresponds to the step described in Embodiment 1 with reference to FIG. 19, and a redundant description thereof is omitted.

Next, a photoresist applied and formed on the second transparent conductive film 9 is patterned by the fifth photolithography process so as to form a resist pattern RM5 shown in FIG. 44. This step corresponds to the step described in Embodiment 1 with reference to FIG. 20, and a redundant description thereof is omitted.

Then, the resist pattern RM5 is used as an etching mask to etch the second transparent conductive film 9 by a wet etching method using PAN-based solution so as to form the top gate conductive film 91 which fills the contact holes 143 and the contact holes 144, and the laminated film LL and the gate wiring 13 are thus electrically connected to each other, whereby the TFT substrate 400 shown in FIG. 36 and FIG. 37 is obtained.

Effects

As described in Embodiment 3, because the laminated film LL having the second metal film 71 is provided above the channel region of the semiconductor layer 4, it is possible to reduce the light reflected by a layer upper than the TFT substrate 400 and entering the semiconductor layer 4 through the channel protective film 5, whereby it is possible to obtain a long-life and highly reliable TFT 20. In addition, in Embodiment 4, because the laminated film LL is electrically connected to the gate wiring 13 (the gate electrode 2), the laminated film LL is also supplied with the same voltage (gate voltage) as the gate electrode 20.

Here, it is reported that the gate voltage applied also from above the semiconductor layer functioning as a channel region improves the reliability of the TFT in "K. Chang, et. al.: SID '15 Digest, p. 1023 (2015)" and it can be expected that the reliability of the TFT 20 is improved by applying the same voltage as the gate voltage also from above the semiconductor layer 4 as the present Embodiment 4.

Embodiment 5

With reference to FIG. 45 to FIG. 53, a description will be given to a configuration and a manufacturing method of a TFT substrate 500 of Embodiment 5 according to the present invention. The present Embodiment 5 has a configuration in which the configuration of the TFT substrate 300 described in Embodiment 3 is partially modified; therefore, the same components as in the TFT substrate 300 are assigned the same reference codes, and redundant descriptions thereof are omitted.

<Configuration of TFT Substrate>

Figure 45:
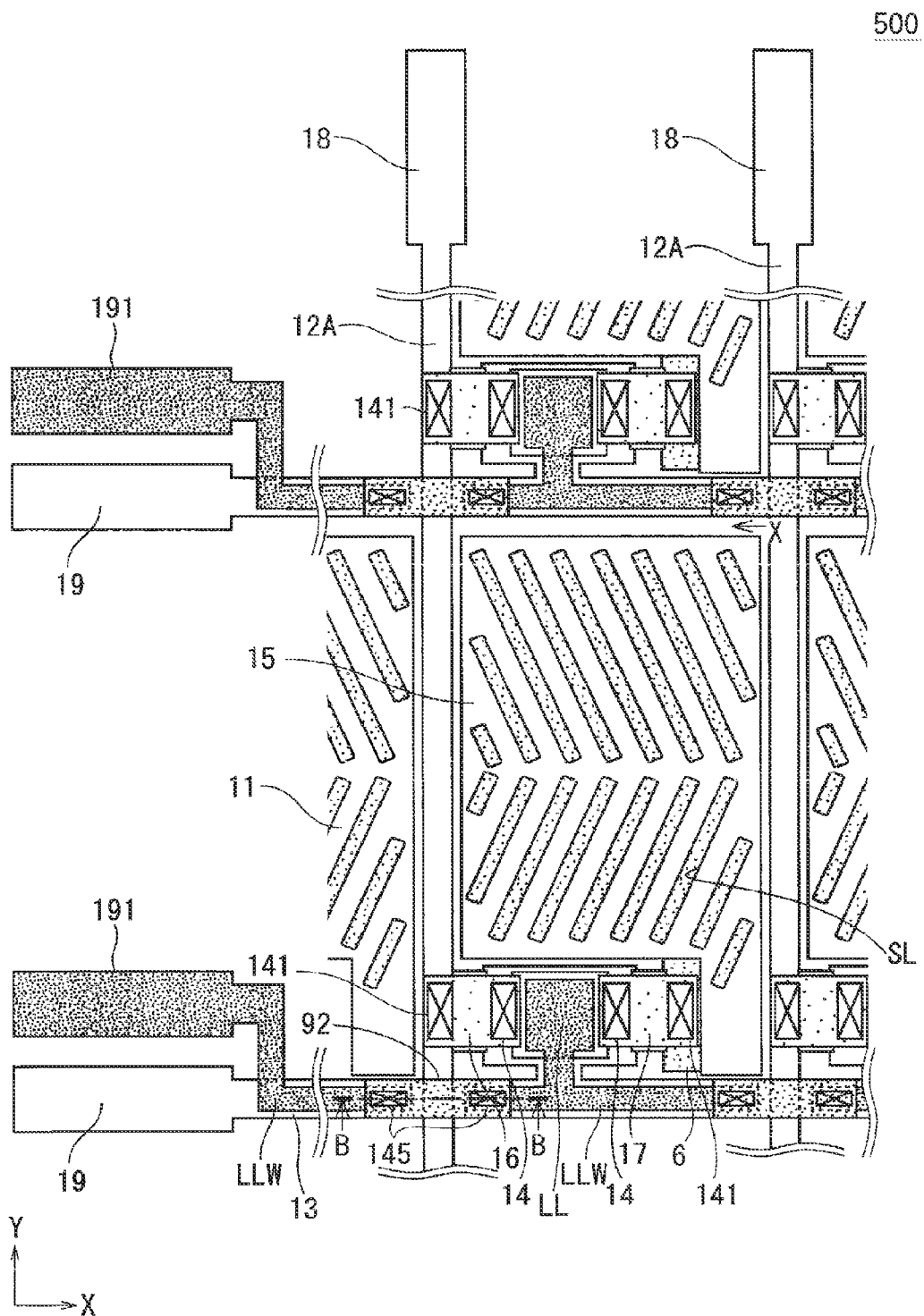
FIG. 45 is a diagram showing a planar configuration of a pixel of a TFT substrate of Embodiment 5 according to the present invention.
Figure 46:
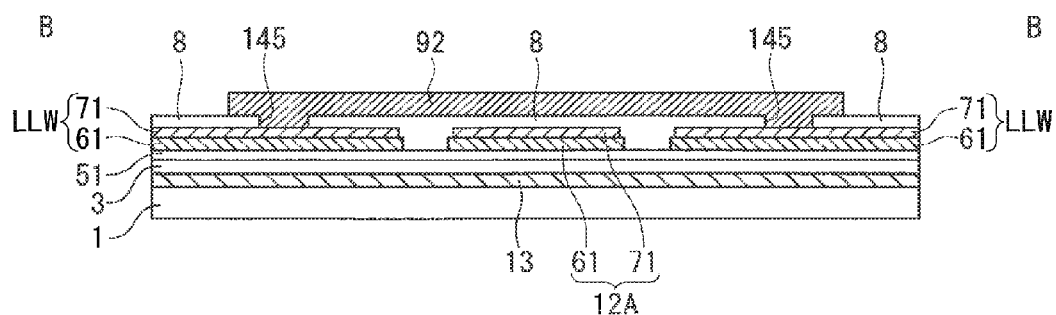
FIG. 46 is a diagram showing a cross-sectional configuration of the pixel of the TFT substrate of Embodiment 5 according to the present invention.

FIG. 45 is a plan view of a pixel part of a TFT substrate 500 of Embodiment 5, and FIG. 46 is a sectional view showing a cross-sectional configuration along line B-B in FIG. 45. In TFT substrate 500, as described in Embodiment 4 with reference to FIG. 37, the laminated film LL constituted by the first transparent conductive film 61 and the second metal film 71 is provided to extend also from above the channel protective film 5 to above the silicon oxide film 51. That is, the laminated film LL is provided so as to extend from above the gate electrode 2 to above the gate wiring 13, and laminated film LL is, above the gate wiring 13, a laminated layer wiring LLW extending along the gate wiring 13 as shown in FIG. 45 and FIG. 46. Because the laminated layer wiring LLW is formed of the same materials and on the same layer as the source wiring 12A, the laminated layer wiring LLW is divided before a crossing part with the source wiring 12A. Further, there is provided a strip-shaped (rectangular) jumper line 92, which is made of the same material as the second transparent conductive film 9, above the source wiring 12A and the laminated layer wiring LLW so as to step over the crossing part with the source wiring 12A. The jumper line 92 is configured to be electrically connected to the second metal film 71 of the laminated layer wiring LLW through contact holes 145 penetrating through the protective film 8.

The laminated layer wiring LLW extends, in the lateral direction (X direction), along the gate wiring 13, and an end part of the laminated layer wiring LLW (in other words, an end part of a substantially single line in which the laminated layer wirings LLW are connected to each other by the jumper line 92 is connected to a laminated layer wiring terminal 191 provided, parallel to the gate terminal 19, at a position apart, in a plan view, from the gate terminal 19. To this laminated layer wiring terminal 191, a ground or arbitrary voltage can be applied.

<Manufacturing Method>

Hereinafter, a manufacturing method of the TFT substrate 500 of Embodiment 5 will be described with reference to FIG. 47 to FIG. 53, which are sectional views sequentially showing the manufacturing process. Note that a sectional view showing the final step corresponds to FIG. 46.

Figure 47:
FIG. 47 is a sectional view showing a manufacturing process of the TFT substrate of Embodiment 5 according to the present invention.

First, after the steps described in Embodiment 1 with reference to FIG. 5 to FIG. 12 are performed, the silicon oxide film 51 is formed, as a first insulation film, on the silicon oxide film 3 in the step shown in FIG. 47. This silicon oxide film 51 functions as the channel protective film 5, above the gate electrode 2 of the TFT 20. This step corresponds to the step described in Embodiment 1 with reference to FIG. 13, and a redundant description thereof is omitted.

Figure 48:
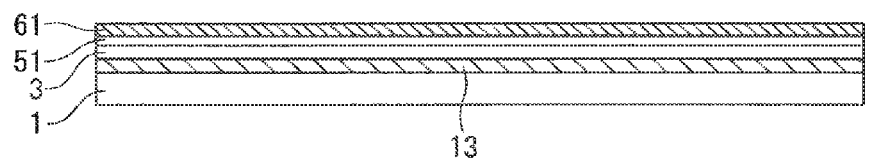
FIG. 48 is a sectional view showing the manufacturing process of the TFT substrate of Embodiment 5 according to the present invention.

Subsequently, in the step shown in FIG. 48, the first transparent conductive film 61 is formed entirely over the silicon oxide film 51. This step corresponds to the step described in Embodiment 1 with reference to FIG. 13, and a redundant description thereof is omitted.

Figure 49:
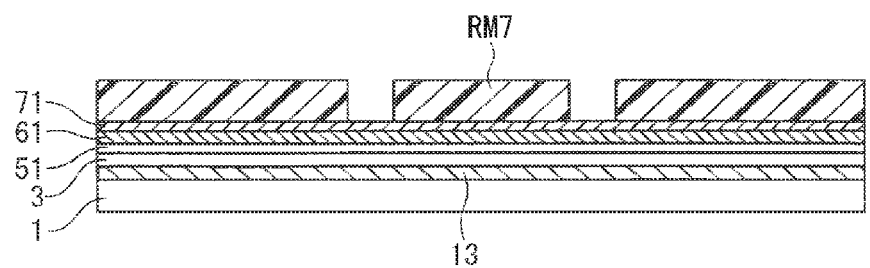
FIG. 49 is a sectional view showing the manufacturing process of the TFT substrate of Embodiment 5 according to the present invention.

Next, in the step shown in FIG. 49, the second metal film 71 is formed of an Al-3 mol % Ni film to have a thickness of 100 nm by a sputtering method entirely over the first transparent conductive film 61, and then a photoresist applied and formed on the second metal film 71 is patterned by the third photolithography process so as to form a resist pattern RM7 for forming the laminated layer wiring LLW above the source wiring 12A and the gate wiring 13. This step corresponds to the step described in Embodiment 3 with reference to FIG. 29, and a redundant description thereof is omitted.

Note that the resist pattern RM7 is formed by exposing the photoresist by a halftone method, and resist pattern RM7 has a first thickness (approximately 1.5 µm) in the region above from the gate wiring 13 to the gate electrode 2.

Then, the resist pattern RM7 is used as an etching mask to remove, by a wet etching method using PAN-based solution, the second metal film 71 (Al-3 mol % Ni film) and the first transparent conductive film 61 (a-ITO film) in the region other than the regions in which the source wiring 12A, the laminated film LL, and the pixel electrode 15 will be formed later, whereby the laminated film LL is patterned. In this step, the source wiring 12A and the pixel electrode 15 are also patterned. This step corresponds to the step described in Embodiment 3 with reference to FIG. 30.

Note that, after this step, there is a step for reducing the thickness of the resist pattern RM7 as a whole by ashing using oxygen plasma (the step described with reference to FIG. 31), and the resist pattern RM7 is used to further etch the second metal film 71, whereby the end positions of the source wiring 12A and the second metal film 71 of the laminated layer wiring LLW are slightly depressed with respect to the end positions of the first transparent conductive film 61. Although there is a step of an annealing treatment to be performed, the description thereof is omitted.

Figure 50:
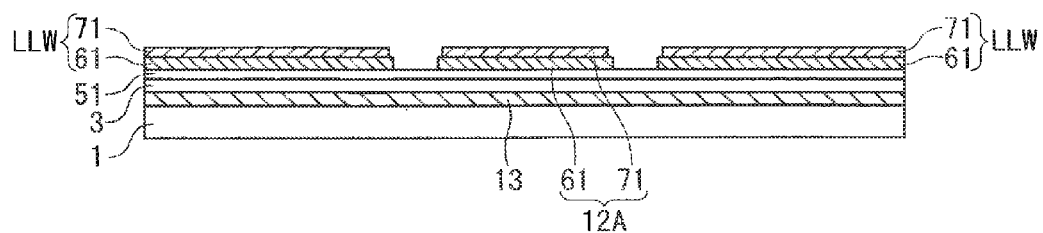
FIG. 50 is a sectional view showing the manufacturing process of the TFT substrate of Embodiment 5 according to the present invention.

Next, the resist pattern RM7 is stripped and removed by using amine-based resist stripping liquid, and the configuration shown in FIG. 50 is thus obtained.

Figure 51:
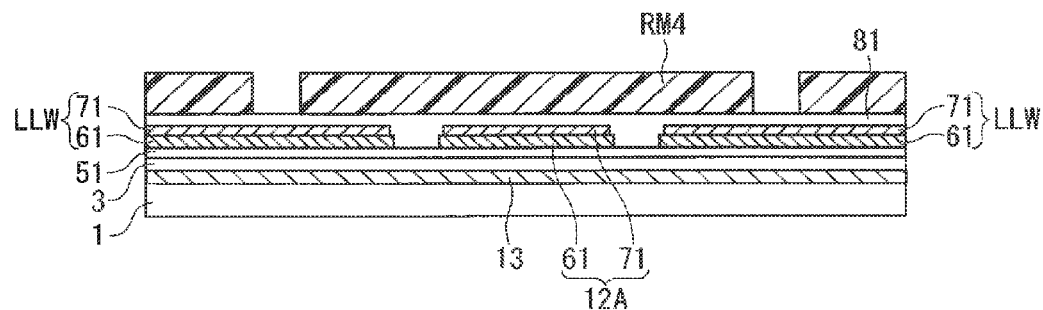
FIG. 51 is a sectional view showing the manufacturing process of the TFT substrate of Embodiment 5 according to the present invention.

Next, in the step shown in FIG. 51, a silicon oxide film 81 is formed as a second insulation film so as to cover the source wiring 12A and the laminated layer wiring LLW. This silicon oxide film 81 functions as the protective film 8. This step corresponds to the step described in Embodiment 1 with reference to FIG. 16, and a redundant description thereof is omitted.

Next, in the step shown in FIG. 51, a photoresist applied and formed on the silicon oxide film 81 is patterned by the fourth photolithography process so as to form a resist pattern RM4 for forming the contact holes 145. This step corresponds to the step described in Embodiment 1 with reference to FIG. 17, and a redundant description thereof is omitted.

Figure 52:
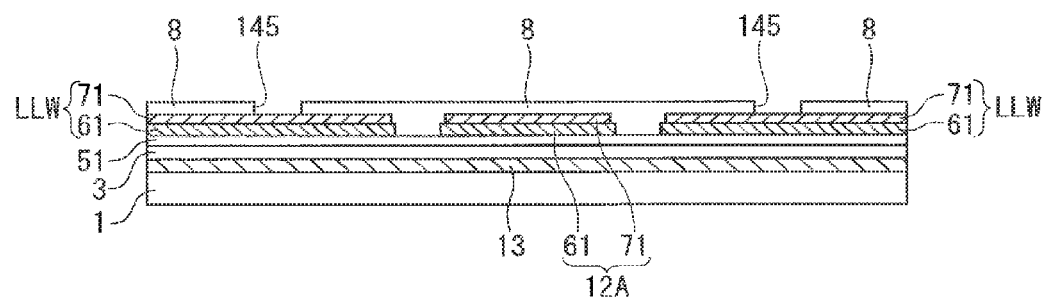
FIG. 52 is a sectional view showing the manufacturing process of the TFT substrate of Embodiment 5 according to the present invention.

Then, in the step shown in FIG. 52, the resist pattern RM4 is used as an etching mask to etch the silicon oxide film 81 by a dry etching method using gas containing fluorine such as $CHF_3$, $CF_4$, and $SF_6$ and oxygen ($O_2$) gas so as to form the contact holes 145 reaching the upper surface of the second metal film 71.

Next, after the resist pattern RM4 is stripped and removed by using amine-based resist stripping liquid, a second transparent conductive film 9 is formed, in the step shown in FIG.

53, entirely over the silicon oxide film 81 including the protective film 8 so as to fill the contact holes 145. This step corresponds to the step described in Embodiment 1 with reference to FIG. 19, and a redundant description thereof is omitted.

Figure 53:
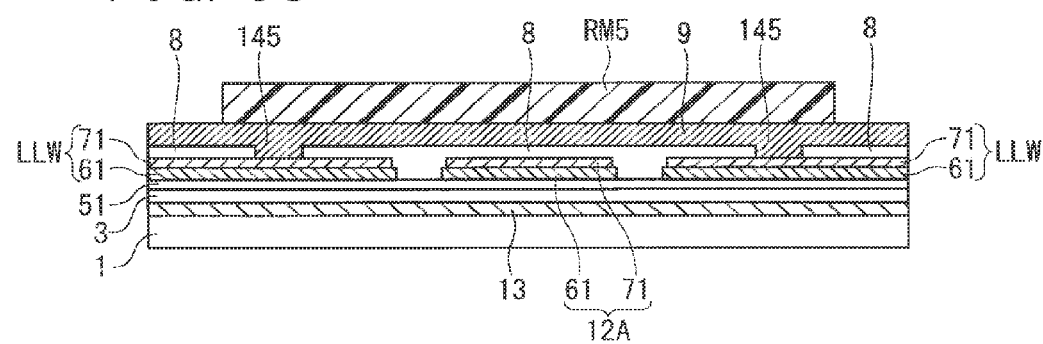
FIG. 53 is a sectional view showing the manufacturing process of the TFT substrate of Embodiment 5 according to the present invention.

Next, a photoresist applied and formed on the second transparent conductive film 9 is patterned by the fifth photolithography process so as to form a resist pattern RM5 shown in FIG. 53. This step corresponds to the step described in Embodiment 1 with reference to FIG. 20, and a redundant description thereof is omitted.

Then, the resist pattern RM5 is used as an etching mask to etch the second transparent conductive film 9 by a wet etching method using PAN-based solution so as to pattern the jumper line 92 above the source wiring 12A and the laminated layer wiring LLW, whereby the TFT substrate 500 shown in FIG. 45 and FIG. 46 is obtained.

The jumper line 92 is made to fill the contact holes 145 and is connected to the second metal film 71. Further, the resist pattern RM5 has a pattern for forming the laminated layer wiring terminal 191, parallel to the gate terminal 19, at a position apart, in a plan view, from the gate terminal 19 (FIG. 45), and one end of the laminated layer wiring LLW is integral with the laminated layer wiring terminal 191.

Effects

As described in Embodiment 3, because the laminated film LL having the second metal film 71 is provided above the channel region of the semiconductor layer 4, it is possible to prevent or reduce the light reflected by a layer upper than the TFT substrate 500 and entering the semiconductor layer 4 through the channel protective film 5, whereby it is possible to obtain a long-life and highly reliable TFT 20. In addition, in Embodiment 5, it is possible to arbitrarily apply a potential to the laminated film LL from the laminated layer wiring terminal 191.

Here, it is reported that, by connecting the conductive film above the semiconductor layer functioning as a channel region, the reliability of the TFT is improved—K. Chang, et. al.: SID '15 Digest, p. 1023 (2015)—and in the present Embodiment 5, a potential can be arbitrarily applied to the laminated film LL above the semiconductor layer 4 from the laminated layer wiring terminal 191; thus, it can be expected that the reliability of the TFT 20 is improved by setting the potential of the laminated film LL to the ground potential.

Embodiment 6

Figure 55:
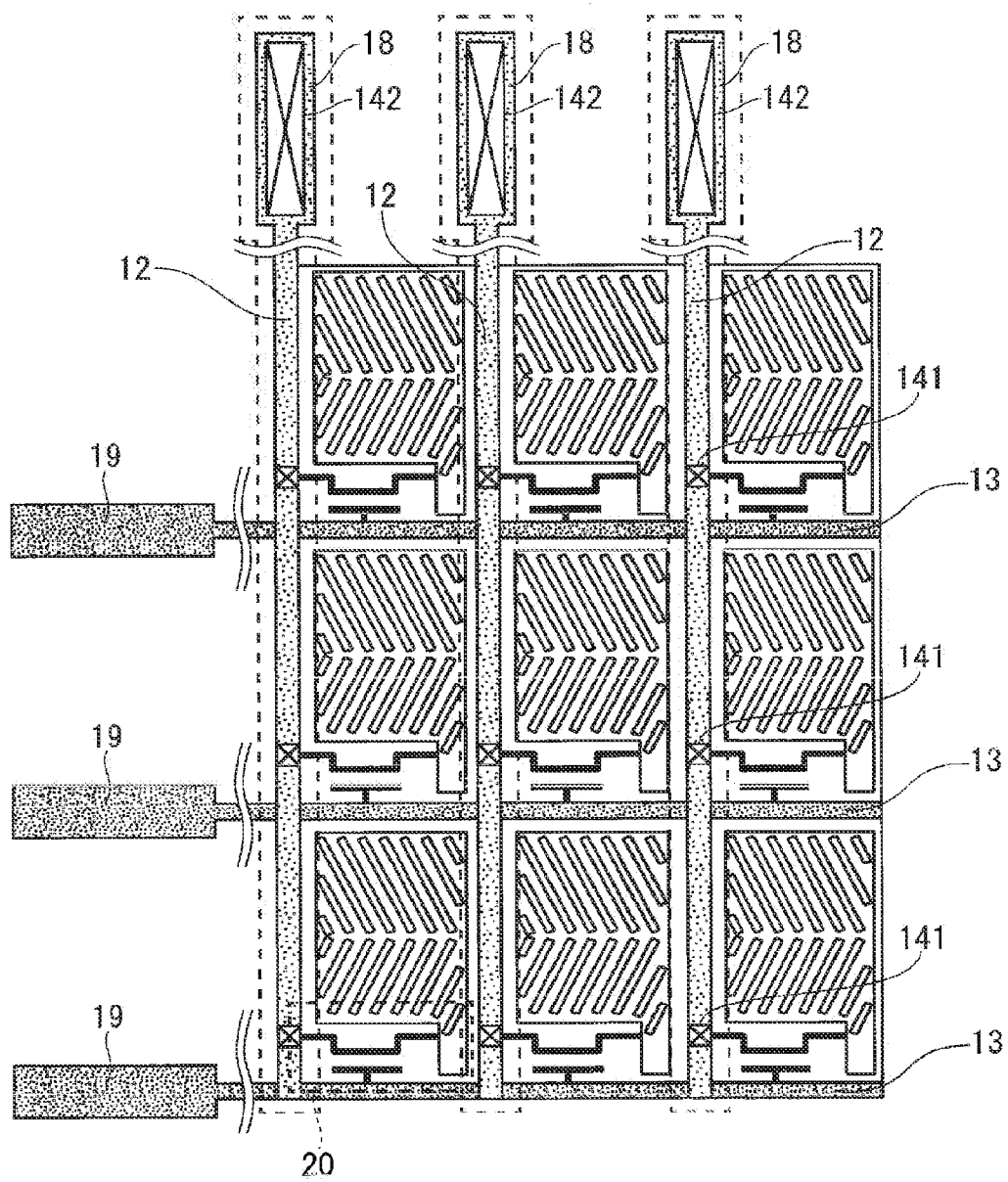
FIG. 55 is a plan view showing a part of a TFT substrate in which pixels are arranged in a matrix.

With reference to FIG. 54 to FIG. 55, a description will be given to a configuration and a manufacturing method of a TFT substrate 600 of Embodiment 6 according to the present invention.

<Cross-Sectional Configuration of TFT Substrate>

FIG. 54 is a sectional view corresponding to the cross-sectional configuration of the pixel part of the TFT substrate 100 according to Embodiment 1 described with reference to FIG. 2; therefore, the same components as in the TFT substrate 100 are assigned the same reference codes, and redundant descriptions thereof are omitted.

As shown in FIG. 54, in the TFT substrate 600, a source electrode 16 and a drain electrode 17 are configured with a laminated film in which a third metal film 10 is laminated on a second transparent conductive film 9. In addition, also above the source wirings 12 and the source terminals 18 in the regions surrounded by the broken lines in FIG. 55, which is a plan view showing part of TFT substrate 600, there are formed laminated films constituted by the second transparent conductive films 9 and the third metal films 10, with the protective film 8 therebetween. Note that the source electrodes 16 are connected to the source wirings 12 through contact holes 141, and the laminated films above the source terminals 18 are connected to the source terminals 18 through contact holes 142 provided to penetrate through the protective films 8 on the source terminals 18.

<Manufacturing Method>

Next, a manufacturing method of the TFT substrate 600 will be described. After the steps described in Embodiment 1 with reference to FIG. 5 to FIG. 19 are performed, the third metal film 10 is laminated on the second transparent conductive film 9 (a-ITO film). Note that the third metal film 10 is configured, in the same manner as the gate electrode 2, with an Al-3 mol % Ni film having a thickness of 100 nm in which Ni of 3 mol % is added to Al.

Next, a photoresist applied and formed on the third metal film 10 is patterned by the fifth photolithography process. In this case, the photoresist is formed to have a thickness of 1.5 μm in such a manner that photoresist material composed of, for example, novolac-based positive photosensitive resin is applied to the third metal film 10 by a coating method. Then, the photoresist is exposed and developed by, for example, a halftone method, and the resist pattern is thus formed to have two different thicknesses.

By using a halftone method, the resist pattern can be formed. The resist pattern has a first thickness (approximately 1.5 μm), which is the thickest, above the source wiring 12 and the source terminal 18 and above the regions which will be later the source electrode 16 and the drain electrode 17, and the resist pattern also has a second thickness, which is about half the first thickness, in the region which will be later the liquid crystal control slit electrode 11.

Next, the resist pattern is used as an etching mask to remove, by a wet etching method using PAN-based solution, the third metal film 10 (Al-3 mol % Ni film) and the second transparent conductive film 9 (a-ITO film) in the region except the regions above the source wiring 12 and the source terminal 18 and except the regions which will be later the source electrode 16, the drain electrode 17, and the liquid crystal control slit electrode 11.

Next, the thickness of the resist pattern is reduced as a whole by ashing with oxygen plasma so that the part of the resist pattern having a thinner film thickness can be perfectly removed so as to make the third metal film 10 on the liquid crystal control slit electrode 11 be exposed and that the resist pattern can be left above the source wiring 12 and the source terminal 18 and on the regions which will be later the source electrode 16 and the drain electrode 17.

Next, an annealing treatment is performed to reform the source electrode 16, the drain electrode 17, the liquid crystal control slit electrode 11, and the second transparent conductive film 9 above the source wiring 12 and the source terminal 18, which are a-ITO films, into polycrystalline ITO (poly-ITO) films having resistance to PAN-based solution.

Next, etching is performed again by a wet etching method using PAN-based solution so as to etch the third metal film 10 (Al-3 mol % Ni film) on the liquid crystal control slit electrode 11, but the liquid crystal control slit electrode 11 having been reformed into a poly-ITO film is left without being removed. Further, films are left without being removed which are the source electrode 16, the drain electrode 17, the liquid crystal control slit electrode 11, and the laminated film above the source wiring 12 and the source terminal 18, on which the resist patterns are left.

Effects

The TFT 20 is exposed to the light of the backlight 104 (FIG. 4) reflected by the color filter 102 (FIG. 4) or the like which is upper than the TFT substrate 600. If a threshold voltage of the TFT 20 is shifted by this radiation of light and exceeds a drive voltage of the gate, the TFT cannot normally operate.

However, because the source electrode 16 and the drain electrode 17 are constituted by the laminated film in which the third metal film 10 is laminated on the second transparent conductive film 9, it is possible to block light reflected by a layer upper than the TFT substrate 600, whereby it is possible to reduce light from entering the semiconductor layer 4 so as to achieve a long-life and highly reliable the TFT 20.

The laminated film in which the third metal film 10 is laminated on the second transparent conductive film 9 is formed also on the source wiring 12, and the laminated film is electrically connected to the source wiring 12; thus, an electric resistance of the source wiring 12 can be reduced.

Embodiment 7

FIG. 56 shows a plan view schematically illustrating a general structure of a TFT substrate. As shown in FIG. 56, the TFT substrate is roughly divided into two regions, and one of the regions is a display region 24 in which pixels each containing the TFT 20 are arranged in a matrix, and the other of the regions is a frame region 23 provided to surround the display region 24.

In the display region 24, a plurality of gate wirings (scan signal lines) 13 and a plurality of source wirings (display signal lines) 12 are arranged perpendicular to each other. In the frame region 23, there are disposed a scan signal drive circuit 25 (first drive circuit) for supply drive voltages to the gate wirings 13 and a display signal drive circuit 26 (second drive circuit) for supplying drive voltages to the source wirings 12.

When the scan signal drive circuit 25 causes a current to flow through one of the gate wirings 13 and the display signal drive circuit 26 causes a current to flow through one of the source wirings 12, the TFT 20 of the pixel at the intersection between those wirings turns into an on-state, and an electric charge is accumulated on a pixel electrode connected to the TFT 20.

In the case that a TFT 20 having an oxide semiconductor channel layer is used, the oxide semiconductor has a high mobility, and the TFT 20 can be accordingly downsized; therefore, if TFTs (driver TFTs) having the same configuration as such a TFT 20 are used to make up the scan signal drive circuit 25 and the display signal drive circuit 26, the scan signal drive circuit 25 and the display signal drive circuit 26 are made small enough to be disposed in the frame region of TFT substrate.

As shown in FIG. 56, the scan signal drive circuit 25 is equipped with a plurality of drive voltage generation circuits SC each of which has TFTs T1, T2, and T3. The display signal drive circuit 26 has the same configuration.

Specifically, the drive voltage generation circuit SC has a TFT T1 whose drain is supplied with a clock signal CLK, a TFT T2 whose source is supplied with a power source potential VSS and whose drain is connected to a source of the TFT T1, and a TFT T3 whose drain is supplied with a power source potential VDD and whose source is connected to a gate of the TFT T1. Note that the source of the TFT T3 is connected to a connection node between the TFTs T1 and T2 through a capacitor C1, and the connection node between the TFTs T1 and T2 functions as an output node N1 to supply a drive voltage to the gate wiring 13 and the source wiring 12.

When a signal supplied to a gate of the TFT T3 turns on the TFT T3, the TFT T1 thus turns to an on-state, whereby the clock signal CLK is output from the output node N1; and when a signal supplied to a gate of the TFT T2 turns on the TFT T2, a potential on the output node N1 thus goes down to the power source potential VSS.

In the drive voltage generation circuit SC having the above-described configuration, the TFTs T1 to T3 may have, for example as shown in FIG. 57, the same cross-sectional configuration as the TFT 20 of the TFT substrate 300 of Embodiment 3 described with reference to FIG. 28.

Specifically, a configuration may be employed in which the laminated film LL including the first transparent conductive film 61 and the second metal film 71 is formed on the channel protective film 5 and in which the protective film 8 is formed to cover the laminated film LL.

When such a configuration is employed, it is possible to reduce light reflected by a layer upper than the TFT substrate and entering the semiconductor layer 4 through the channel protective film 5, whereby a long-life and highly reliable TFT can be obtained.

In this case, a configuration may be made in which the laminated film LL including the first transparent conductive film 61 and the second metal film 71 is not provided on the channel protective film 5 of the TFT 20 in the display region 24 and in which only the protective film 8 is provided on the channel protective film 5 as described with reference to FIG. 2. This arrangement prevents or reduces creation of a parasitic capacitance on the semiconductor layer 4.

Note that the manufacturing method of the TFTs T1 to T3 is the same as that of the TFT 20 of the TFT substrate 300 described in Embodiment 3.

Although the present invention is described in detail, the above descriptions are examples in every aspect, and the present invention is not limited to the above descriptions. It should be understood that numerous unillustrated modified examples can be considered without departing from the scope of the present invention.

Note that it is possible to arbitrarily combine respective embodiments and to appropriately deform or skip respective embodiments without departing from the scope of the present invention.

The invention claimed is:

1. A thin-film transistor substrate comprising a matrix of a plurality of pixels,
    wherein each of said plurality of pixels including:
    a thin-film transistor, said thin-film transistor including:
    a gate electrode provided on a substrate;
    a gate insulating film covering at least said gate electrode;
    a semiconductor layer provided at a position opposing said gate electrode with said gate insulating film between said semiconductor layer and said gate electrode;
    a channel protective film covering over at least said semiconductor layer;
    a protective film covering over at least said channel protective film; and
    a source electrode and a drain electrode respectively being in contact with said semiconductor layer through respective first contact holes provided to penetrate through said protective film and said channel protective film;

a first electrode electrically connected to said drain electrode;

a gate wiring extending from said gate electrode; and a source wiring electrically connected to said source electrode, wherein said source wiring and said first electrode are respectively electrically connected to said source electrode and said drain electrode through respective second contact holes provided to penetrate through said protective film, said first electrode and said source wiring have a first transparent conductive film formed on said first insulation film, and said first insulation film is formed of the same material as said channel protective film; and said source electrode and said drain electrode are provided on a second insulation film made of the same material as said protective film, and each of said plurality of pixels includes a second electrode, which has a slit opening and is disposed at a position facing said first electrode, with said second insulation film between said first electrode and said second electrode; and said semiconductor layer is formed of an oxide semiconductor.

2. The thin-film transistor substrate according to claim 1, wherein said source wiring further includes a metal film formed on said first transparent conductive film.

3. The thin-film transistor substrate according to claim 2, wherein said thin-film transistor further includes said first transparent conductive film and said metal film formed in this order on said channel protective film, and said protective film covers said first transparent conductive film and said metal film on said channel protective film.

4. The thin-film transistor substrate according to claim 3, wherein said first transparent conductive film and said metal film which are on said channel protective film are provided in a region from above said semiconductor layer to above said gate wiring, said thin-film transistor further includes a top gate conductive film selectively formed on said protective film, said top gate conductive film is in contact with said metal film through a third contact hole provided, outside of a region above said semiconductor layer, to penetrate through said protective film, and said top gate conductive film is further in contact with said gate wiring through a fourth contact hole provided to penetrate through said protective film, said channel protective film, and said gate insulating film which are on said gate wiring.

5. The thin-film transistor substrate according to claim 3, wherein said first transparent conductive film and said metal film which are on said channel protective film are provided in a region above said semiconductor layer to above said gate wiring and are provided in a region above said gate wiring, in the region above said gate wiring, said first transparent conductive film and said metal film which are on said channel protective film extend along said gate wiring as a laminated layer wiring, said laminated layer wiring is divided before, in a plan view, a crossing part with said source wiring, said thin-film transistor further includes a jumper line formed on said protective film, said jumper line is provided above a part at which said laminated layer wiring is divided, and said jumper line is in contact with said laminated layer wiring through fifth contact holes provided to penetrate through said protective film such that said jumper line electrically connects between said divided laminated layer wirings.

6. The thin-film transistor substrate according to claim 3, comprising:

a first drive circuit configured to supply a drive voltage to said gate wiring; and a second drive circuit configured to supply a drive voltage to said source wiring, wherein said first drive circuit and said second drive circuit each generate said drive voltage by a drive voltage generation circuit configured with the same driver thin-film transistor as said thin-film transistor.

7. The thin-film transistor substrate according to claim 1, wherein said source electrode, said drain electrode, and said second electrode include a second transparent conductive film formed on said second insulation film.

8. The thin-film transistor substrate according to claim 7, wherein said source electrode and said drain electrode further include a third metal film formed on said second transparent conductive film, said source wiring is covered with said second insulation film, and said third metal film is formed above said source wiring via said second insulation film.

9. A liquid crystal display comprising:

the thin-film transistor substrate according to claim 1;

a counter substrate disposed to face said thin-film transistor substrate; and a liquid crystal layer held between said thin-film transistor and said counter substrate.

10. A manufacturing method of a thin-film transistor substrate comprising a matrix of a plurality of pixels, the manufacturing method comprising the steps of:

(a) forming a first metal film on a substrate, and then, forming a gate electrode and a gate wiring by patterning said first metal film by a photolithography process and an etching process;

(b) forming a gate insulating film to cover said gate electrode and said gate wiring;

(c) forming a first semiconductor layer on said gate insulating film, and then, forming a semiconductor layer at a position facing said gate electrode by patterning said first semiconductor layer by a photolithography process and an etching process;

(d) forming a first insulation film on said gate insulating film to cover said semiconductor layer, and then, forming a first transparent conductive film and a second metal film in this order on said first insulation film;

(e) forming a laminated film constituted by said first transparent conductive film and said second metal film in a first region, a second region, and a third region by patterning said second metal film and said first transparent conductive film by a photolithography process and an etching process;

(f) leaving, in said first region and said third region, a resist formed by the photolithography process in said step (e), and removing, from said second region, said resist;

(g) etching said second metal film, while said resist is left in said first region and the third region, to remove said second metal film from said second region so as to form:

a first electrode in said second region;

a source wiring which further includes said second metal film on said first transparent conductive film; and a laminated film constituted by said first transparent conductive film and said second metal film, on a channel protective film;

(h) forming a second insulation film on said first insulation film to cover said source wiring, said laminated film, and said first electrode;

(i) forming, by a photolithography process and an etching process:

a first contact hole which penetrates through said second insulation film and said first insulation film to reach said semiconductor layer, and a second contact hole which penetrates through said second insulation film to reach said second metal film and said first electrode;

(j) forming a second transparent conductive film on said second insulation film to fill said first contact hole and said second contact hole; and (k) forming a source electrode, a drain electrode, and a second electrode by patterning said second transparent conductive film by a photolithography process and an etching process.

11. The manufacturing method of a thin-film transistor substrate according to claim 10, wherein said step (e) includes:

(e-1) in said photolithography process, forming a resist pattern which has, in said first region and the third region, a first film-thickness part and has, in said second region, a second film-thickness part having a thickness thinner than said first film-thickness part; and (e-2) in said etching process, patterning said second metal film and said first transparent conductive film, by using said resist pattern, and said step (f) includes a step of, by reducing a film thickness of said resist pattern to eliminate said second film-thickness part of said resist pattern, leaving said resist in said first region and the third region, and removing said resist from said second region.

12. The manufacturing method of a thin-film transistor substrate according to claim 10, wherein said step (d) includes a step of forming said first transparent conductive film of an amorphous ITO film, said step (f) further includes a step of performing, after said etching process, an annealing treatment on said thin-film transistor substrate so as to reform said first transparent conductive film into a polycrystalline ITO film, and said step (g) performs etching of said second metal film by using PAN-based solution.

13. The manufacturing method of a thin-film transistor substrate according to claim 10, wherein said step (c) includes a step of forming said first semiconductor layer of an oxide semiconductor.

* * * * *